United States Patent
Sasaki et al.

(10) Patent No.: US 6,897,454 B2
(45) Date of Patent: May 24, 2005

(54) ENERGY BEAM EXPOSURE METHOD AND EXPOSURE APPARATUS

(75) Inventors: Noriaki Sasaki, Yokohama (JP); Tetsuro Nakasugi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/443,856

(22) Filed: May 23, 2003

(65) Prior Publication Data

US 2004/0011966 A1 Jan. 22, 2004

(30) Foreign Application Priority Data

May 24, 2002 (JP) ....................................... 2002-151312

(51) Int. Cl.$^7$ ............................................... A61N 5/00
(52) U.S. Cl. .............................. 250/492.1; 250/492.22; 250/398
(58) Field of Search ........................ 250/492.1, 492.22, 250/398

(56) References Cited

U.S. PATENT DOCUMENTS

| | | | |
|---|---|---|---|
| 5,396,077 A | | 3/1995 | Sohda et al. |
| 5,929,457 A | * | 7/1999 | Okino .................... 250/492.22 |
| 6,559,456 B1 | * | 5/2003 | Muraki ..................... 250/491.1 |
| 6,703,629 B2 | * | 3/2004 | Nakasugi ............... 250/492.22 |

FOREIGN PATENT DOCUMENTS

JP 2000-012426 1/2000

OTHER PUBLICATIONS

Nakasugi, T., Charged Beam Exposure Apparatus Having Blanking Aperture and Basic Figure Aperture, U.S. Appl. No. 09/912,365, filed Jul. 26, 2001.

\* cited by examiner

Primary Examiner—John R. Lee
Assistant Examiner—Zia R. Hashmi
(74) Attorney, Agent, or Firm—Finnegan, Henderson, Farabow, Garrett & Dunner, L.L.P.

(57) ABSTRACT

An exposure method using an energy beam exposure apparatus capable of controlling magnitude relation between blurs of energy beam in first and second directions for exposing a pattern on a sample in the apparatus in a state in which the blur of energy beam in one direction of the first and second directions is set smaller than the blur of energy beam in the other direction comprises adjusting the magnitude relation of the blurs of energy beam in the first and second directions, adjusting the direction of the sample in the apparatus on the basis of the pattern and the magnitude relation of the blurs of energy beam in the first and second directions, and projecting the pattern onto the sample by exposing the sample to the energy beam and using shape correction of the pattern needed to compensate blurs of energy beam in the first and second directions.

21 Claims, 25 Drawing Sheets

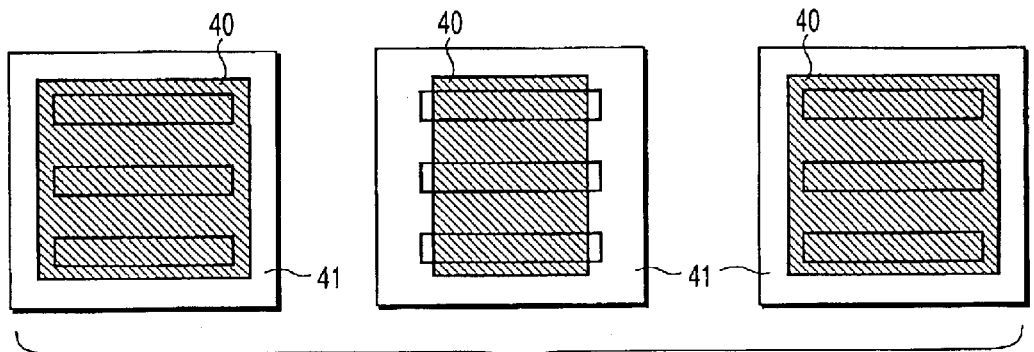
FIG. 14A
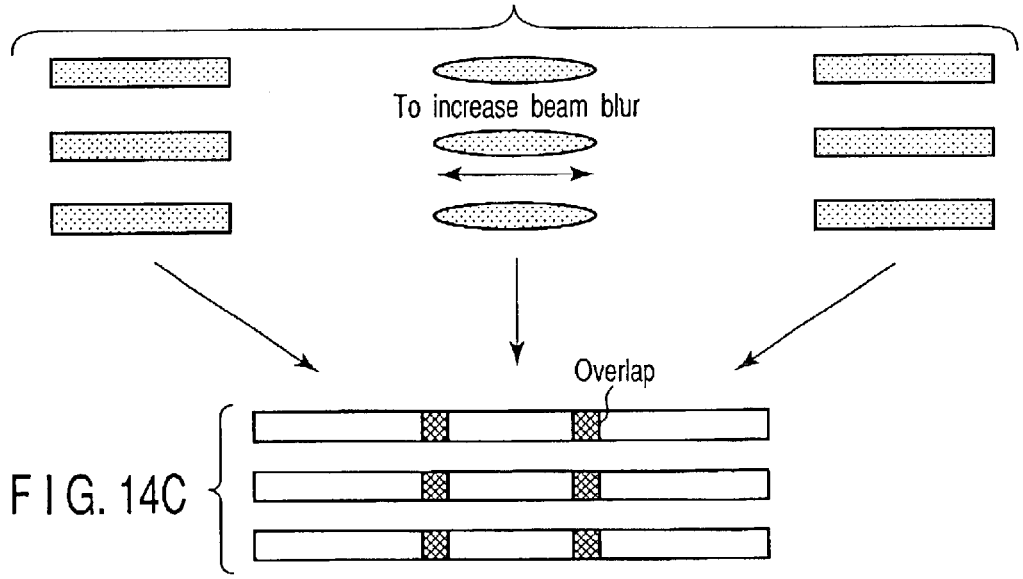
FIG. 14B
FIG. 14C
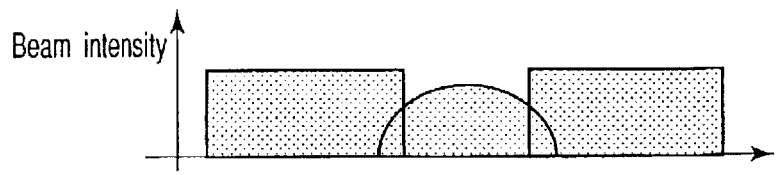
FIG. 14D

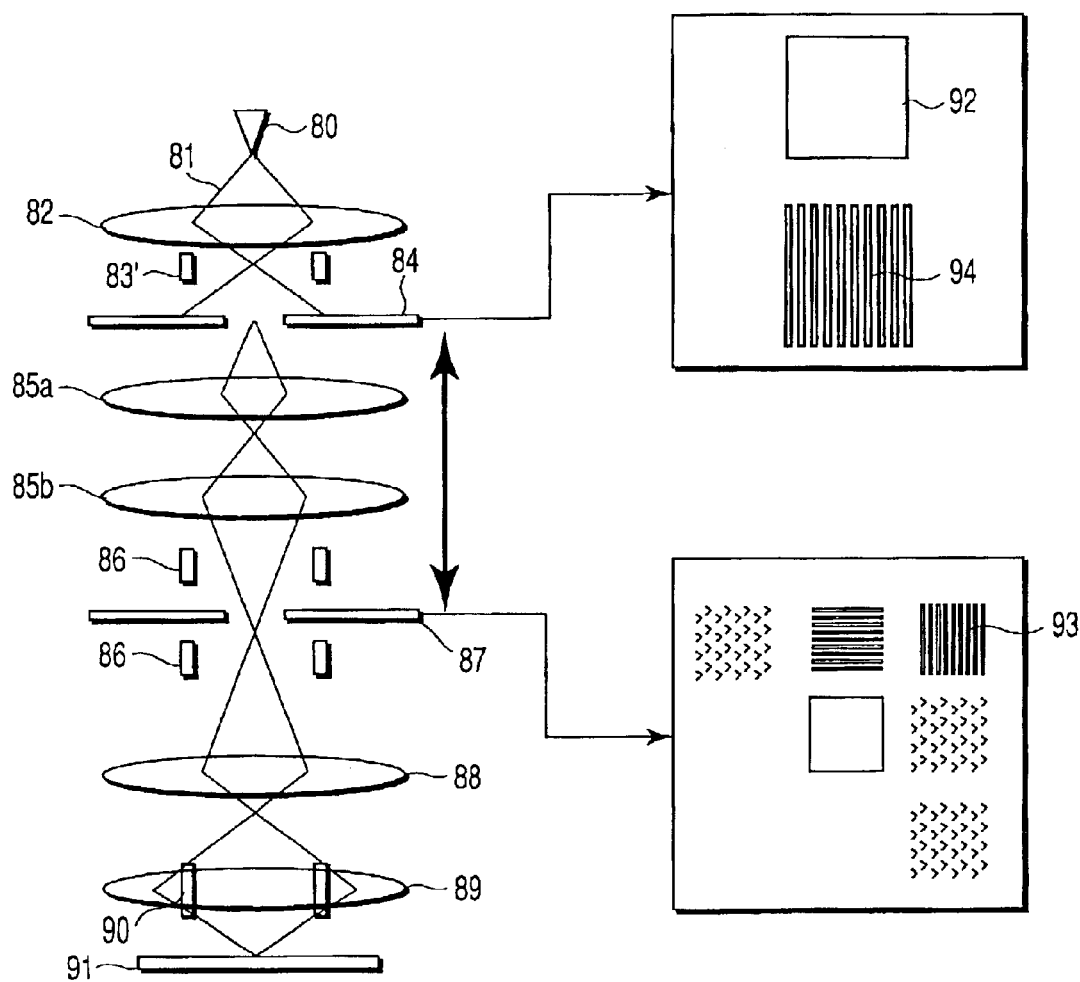
F I G. 22

ENERGY BEAM EXPOSURE METHOD AND EXPOSURE APPARATUS

CROSS-REFERENCE TO RELATED APPLICATIONS

This application is based upon and claims the benefit of priority from the prior Japanese Patent Application No. 2002-151312, filed May 24, 2002, the entire contents of which are incorporated herein by reference.

BACKGROUND OF THE INVENTION

1. Field of the Invention

The present invention relates to an energy beam exposure method and an exposure apparatus for use in manufacture of a semiconductor device.

2. Description of the Related Art

Recently, as large scale integrated circuits (LSI) are becoming higher in density, electron beam exposure (EB exposure) is actually used. One type of EB exposure is character projection exposure (CP exposure) which is a kind of partial batch exposure. In this system (CP system), from an aperture mask (CP aperture mask) having plural character projection patterns (CP patterns), a desired CP pattern is selected, and the electron beam having passed through this selected CP pattern is reduced to a desired size of the sample and emitted.

However, the conventional CP exposure method involves the following problems. In the case of beam adjustment before exposure of an electron beam exposure apparatus using a general rotation symmetrical lens, astigmatism adjustment is done. The astigmatism adjustment is done such that the beam blurs in the X- and Y-directions may be identical. On the other hand, as shown in FIG. 27, when different beam blurs are set in the X- and Y-directions, the resolution in a specific direction can be enhanced.

Recently, a charged beam exposure apparatus using a multiple-pole lens designed to pass through different projectories is being researched. When using a multiple-pole lens, since the beam trajectories in the X- and Y-directions are different, there is no beam blur crossover (beam converging point). The advantage is that the beam blur can be reduced, but the beam blur differs in the X- and Y-directions on principle. In such a case, therefore, the CP pattern cannot be correctly transferred onto the sample by the conventional CP exposure.

More recently, effectiveness of a method of forming the wiring in a 45-degree or 135-degree direction is confirmed. That is, as compared with the conventional wiring connected in the vertical or horizontal direction, oblique wiring can enhance the operating speed of the semiconductor device by wiring the elements straightly.

However, considering oblique wiring by the conventional exposure technology, the following problems are present.

First, to form an oblique CP pattern corresponding to the oblique wiring, as shown in FIG. 28A and FIG. 28B, it is required to form an opening 200 inclined to the X- or Y-direction on the aperture mask. The opening 200 in FIG. 28A shows one rectangular opening inclined obliquely, and the opening 200 in FIG. 28B shows an opening obtained by forming plural square openings in an oblique direction. The problem is that the obliquely inclined opening 200 of this kind is hard to manufacture as compared with the opening parallel to the X- or Y-direction.

Further, using triangular or square CP pattern, when forming an oblique shot pattern (exposure pattern) by linking the triangular or square beams 201 in an oblique direction as shown in FIG. 29A and FIG. 29B, the number of beam shots increases and the exposure time becomes longer. It means a longer manufacturing time is needed in LSI manufacture.

Alternatively, in the case of oblique wiring by using variable shaping beam (VSB), if the beam blur differs in the X- and Y-direction, the pattern dimension may differ. That is, in the case of oblique wiring by using an exposure apparatus different in the beam blurs in the X- and Y-directions, it is hard to transfer the oblique wiring pattern with high precision.

In the EB exposure, the region to be exposed is divided into plural beam deflection regions, and is exposed. Herein, the maximum beam size is only several $\mu$m square, and the pattern to be exposed must be divided into shots of several $\mu$m square. Accordingly, when exposing a pattern larger than the maximum beam size, this large pattern is formed by plural shot patterns, and shot linking (shot junction) occurs.

In the conventional electron beam exposure apparatus different in the beam blurs in the X- and Y-directions, there is a position deviation of several nanometers or tens of nanometers respectively among shot positions and among fields. Therefore, as the pattern becomes finer, the effect of difference of beam blurs in the X- and Y-directions becomes larger. As a result, patterns to be linked in design may not be actually linked, or patterns not to be linked in design are actually linked, and pattern defects occur. Specifically, problems of open defect and short defect of wiring are likely to occur. It also leads to decline of reliability of device and drop of yield.

In manufacture of LSIs, uniformity of dimensions within wafer is important. In the recent finer pattern trend, the demand for dimensional precision is becoming severer. One of the causes of dimensional variation of pattern is a local fluctuation of pattern size occurring at the time of etching. This phenomenon is explained by referring to FIG. 30A and FIG. 30B.

In FIG. 30A and FIG. 30B, reference numeral 300 is a substrate, 301 is a film to be processed, 302 is a resist pattern, and 302a and 302b are resist pattern blocks. As shown in FIG. 30B, the spacing is wide between the resist pattern blocks 302a and 302b.

When the film 301 is etched in this state, as shown in FIG. 30B, the size of the etching pattern 301a of the film at the right end of the resist pattern block 302a increases. Similarly, the size of the etching pattern 301b of the film at the left end of the resist pattern block 302b increases. That is, the pattern size of the film 310 increases at the lower side of the pattern covering rate, which is a local dimensional variation.

As a measure against such local dimensional variation, the pattern dimension at the location of dimensional variation may be corrected at the stage of the design data.

When such a method is employed, however, new problems occur as follows.

The dimensional variation amount of an etching pattern depends on the etching condition. Therefore, every time the etching condition is changed, the design data must be corrected. In this case, it is needed to remake the drawing data in the EB exposure. Or, in the case of partial batch exposure (CP exposure) or batch transfer exposure, it is necessary to remake the aperture mask such as a partial batch mask (CP mask) or transfer mask. It leads to other problems, such as a longer time required in exposure process, a longer manufacturing period in the LSI manufacture, and a higher manufacturing cost.

Besides, the electron beam exposure apparatus of the conventional CP system has the following problem. The beam blur increases in proportion to the beam current as shown in formula (1).

$$\text{Blur} = (I \cdot L)/(\alpha \cdot V^{1.5}) \quad (1)$$

where I is a beam current, L is an optical path length (distance from an electron gun to a wafer), $\alpha$ is an opening angle, and V is an acceleration voltage.

Accordingly, the beam blur of the L/S pattern larger in the total beam current is larger than that of an independent pattern smaller in the total beam current, and the resolution deteriorates.

BRIEF SUMMARY OF THE INVENTION

According to an aspect of the invention, there is provided an energy beam exposure method using an energy beam exposure apparatus capable of controlling magnitude relation between a blur of energy beam in a first direction and a blur of energy beam in a second direction different from the first direction, for exposing a pattern on a sample in the energy beam exposure apparatus in a state in which the blur of energy beam in one direction of the first and second directions is set smaller than the blur of energy beam in the other direction according to an aspect of the present invention comprises adjusting the magnitude relation of the blurs of energy beam in the first and second directions; adjusting the direction of the sample in the energy beam exposure apparatus on the basis of the pattern to be projected onto the sample and the magnitude relation of the blurs of energy beam in the first and second directions; and projecting the pattern onto the sample by exposing the sample to the energy beam and using shape correction of the pattern, the shape correction being needed to compensate blurs of energy beam in the first and second directions are different from each other.

According to another aspect of the invention, there is provided an energy beam exposure method using an energy beam exposure apparatus capable of controlling the magnitude relation between a blur of energy beam in a first direction and a blur of energy beam in a second direction different from the first direction, for exposing a pattern comprising a plurality of shot patterns on a sample in the energy beam exposure apparatus in a state in which the blur of energy beam in one direction of the first and second directions is set smaller than the blur of energy beam in the other direction according to another aspect of the present invention comprises determining an overlap quantity of the adjacent two shot patterns depending on the blur of energy beam in a direction of linking the plurality of shot patterns; and projecting the pattern onto the sample by exposing the sample to the energy beam according to the overlap quantity.

According to another aspect of the invention, there is provided an energy beam exposure method for exposing a plurality of patterns, each of which comprises a plurality of sub-patterns, on a sample, according to another aspect of the present invention comprises deciding presence or absence of a pattern corresponding to a shot pattern which is not formed in a predetermined dimension, when forming the plurality of shot patterns corresponding to the plurality of patterns on the sample in a predetermined dimension, by projecting the plurality of patterns onto the sample by exposing the sample to the beam with a predetermined exposure amount; detecting a sub-pattern which is not formed in a predetermined dimension on the sample, out of the plurality of sub-patterns configuring the pattern, when there is a pattern corresponding to the shot pattern which is not formed in a predetermined dimension; and exposing those capable of forming the shot pattern in the predetermined dimension out of the plurality of patterns by the predetermined exposure amount, exposing others not capable of forming the shot pattern in the predetermined dimension by an exposure amount smaller than the predetermined exposure amount, and exposing the sub-pattern detected as not being formed in a predetermined dimension selectively by a correction exposure amount.

According to another aspect of the invention, there is provided an energy beam exposure method using an aperture mask including a plurality of character projection patterns, each of which comprises a plurality of patterns, according to another aspect of the present invention comprises deciding presence or absence of a character projection pattern corresponding to a shot pattern which is not formed in a predetermined dimension, when forming the plurality of shot patterns corresponding to the plurality of character projection patterns on the sample in a predetermined dimension, by exposing the plurality of character projection patterns by a predetermined exposure amount; detecting a pattern which is not formed in the predetermined dimension on the sample, out of the plurality of character projection patterns, when there is a character generation pattern corresponding to the shot pattern which is not formed in a predetermined dimension; and exposing those capable of forming the shot pattern in the predetermined dimension out of the plurality of patterns by the predetermined exposure amount, exposing others not capable of forming the shot pattern in the predetermined dimension by an exposure amount smaller than the predetermined exposure amount, and exposing the pattern detected as not being formed in a predetermined dimension selectively by a correction exposure amount.

According to another aspect of the invention, there is provided an energy beam exposure method using an aperture mask including character projection patterns according to another aspect of the present invention comprises configuring a character projection pattern corresponding to a desired graphic pattern with opening including linear opening, the liner opening having a width smaller than that of the smallest part of the character projection pattern when a shot pattern of a predetermined dimension can be formed on the sample by exposing the character projection pattern corresponding to the desired graphic pattern by a predetermined exposure amount; and forming the shot pattern of the predetermined dimension on the sample by exposing a character projection pattern with the opening including the linear opening by an exposure amount larger than the predetermined exposure amount.

According to an aspect of the invention, there is provided an energy beam exposure apparatus according to another aspect of the present invention comprises a first aperture mask comprising a first pattern opening portion, the first pattern opening portion including a plurality of openings, the plurality of openings being disposed periodically; a second aperture mask including a plurality of pattern opening portions; an irradiation unit selectively irradiating a desired position of the plurality of pattern opening portions on the second aperture mask with a energy beam which is passed through the first pattern opening portion of the first aperture; and a transfer unit reducibly transferring the energy beam which is passed through the desired position of the plurality of pattern opening portions of the second aperture mask on a sample.

According to another aspect of the invention, there is provided an energy beam exposure method using an aperture mask including character projection patterns according to another aspect of the present invention comprises configuring a character projection pattern corresponding to a desired graphic pattern with opening including linear opening, the liner opening having a width smaller than that of the smallest part of the character projection pattern when a shot pattern of a predetermined pattern can be formed on the sample exposing the character projection pattern corresponding to the desired graphic pattern by a predetermined exposure amount; and forming the shot pattern of the predetermined pattern on the sample by exposing a character projection pattern with the opening including the linear opening by an exposure amount larger than the predetermined exposure amount.

According to another aspect of the invention, there is provided an energy beam exposure method using an energy beam exposure apparatus according to another aspect of the present invention comprises preparing an energy beam exposure apparatus, the energy beam exposure apparatus comprising the energy beam exposure apparatus including a first aperture mask comprising a first pattern opening portion, the first pattern opening portion including a plurality of openings, the plurality of openings being disposed periodically; a second aperture mask including a plurality of pattern opening portions; an irradiation unit selectively irradiating a desired position of the plurality of pattern opening portions on the second aperture mask with the energy beam which is passed through the first pattern opening portion of the first aperture; and a transfer unit reducibly transferring a energy beam which is passed through the desired position of the plurality of pattern opening portions of the second aperture mask on a sample; configuring a pattern opening portion corresponding to a desired graphic pattern with opening including linear opening, the liner opening having a width smaller than that of the smallest part of the pattern opening portion corresponding to the desired graphic pattern when a shot pattern of a predetermined dimension can be formed on the sample by exposing the pattern opening portion corresponding to the desired graphic pattern in the plurality of openings on the second aperture mask by a predetermined exposure amount; and forming the shot pattern of the predetermined dimension on the sample by exposing the pattern opening portion with the opening including the linear opening by an exposure amount larger than the predetermined exposure amount.

BRIEF DESCRIPTION OF THE SEVERAL VIEWS OF THE DRAWINGS

FIG. 14A to FIG. 14D are schematic structural diagrams of an exposure apparatus having a mechanism for adjusting a beam blur in X- and Y-directions.

FIG. 22 is a schematic structural diagram of an exposure apparatus according to the eleventh embodiment.

DETAILED DESCRIPTION OF THE INVENTION

Hereinafter, the embodiments of the present invention will be described with reference to the accompanying drawing.

(First Embodiment)

Figure 1:
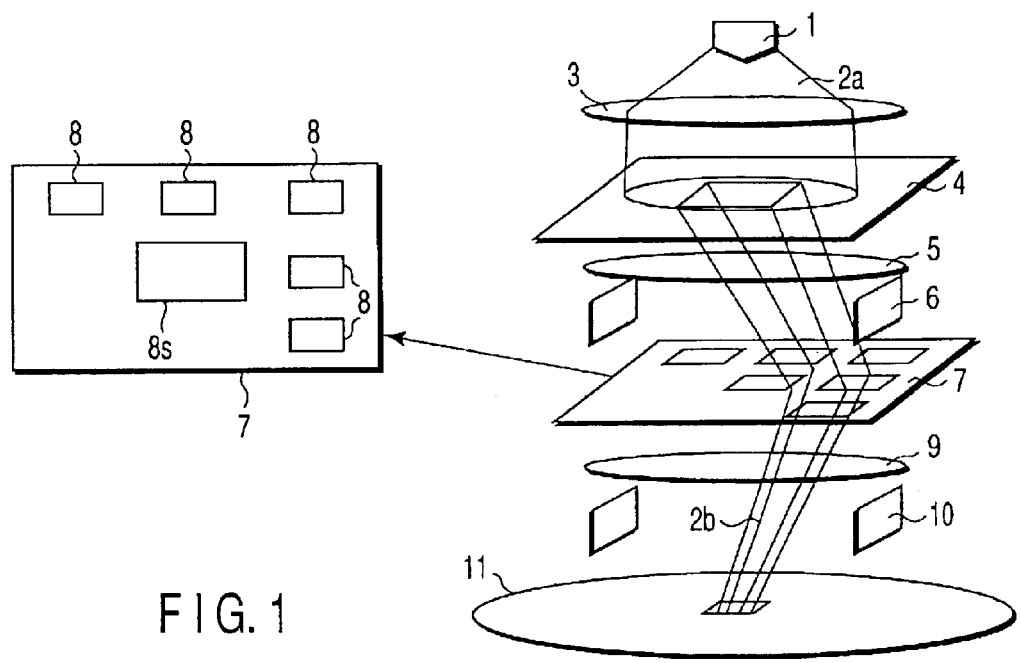
FIG. 1 is a schematic structural diagram of exposure apparatus according to a first embodiment of the present invention.

FIG. 1 is a schematic structural diagram of an exposure apparatus according to a first embodiment of the present invention. In the following description of embodiments, same reference numerals refer to same components, and specific explanation is omitted.

The exposure apparatus of this embodiment is a CP and variable shape type electron beam exposure apparatus having an acceleration voltage of 5 keV. The value of the acceleration voltage is not limited to 5 keV.

In FIG. 1, reference numeral 1 is an electron gun, and an electron beam 2a generated from the electron gun 1 passes through a lens 3, a first aperture mask 4, and a lens 5, and is emitted to a desired position on a second aperture mask 7 (CP aperture mask) by means of a deflector 6. An opening for pattern (CP pattern) 8 is provided in the CP aperture mask 7. In FIG. 1, reference numeral 8s shows a square opening.

In this apparatus, the number of CP patterns 8 is 400 (only part is shown), and each CP pattern 8 is composed in every standard cell (SC). Herein, the SC is a basic part for composing a circuit, and the LSI pattern composes a complicated circuit by combining a plurality of SCs.

The electron beam 2b having passed through the CP aperture mask 7 is reducibly projected onto a desired position of a wafer (sample) 11 by way of a lens 9 and a deflector 10. The deflector 10 is an electrostatic deflector, but another type may be also used. The reduction factor of the apparatus is $1/10$, and the maximum beam size is 10 μm. Hence, the size of the CP pattern 8 is 100 μm square.

The defectors 6 and 10 for use in the apparatus are composed of known electrostatic deflectors having eight electrodes. The lenses 3, 5, 9 for use in the apparatus are also composed of known electrostatic lenses having eight electrodes. The electrostatic lens for composing the lenses 3 and 5 is composed of a known general rotation symmetrical lens, and the electrostatic lens for composing the lens 9 is composed as a known quadrupole lens having two electrodes as one set.

In the quadrupole lens, by applying the same voltage +V to a pair of opposite electrodes, and applying a voltage –V having reverse polarity to a pair of orthogonal electrodes, the beam trajectory converges in either the X-direction or Y-direction. Accordingly, to control the beam trajectory in the X- and Y-directions, two lenses are combined.

Herein, the lens 9 includes functions of a reducing lens and objective lens. Therefore, although not shown, a four-stage quadrupole lens is composed. Since the quadrupole lens differs in the beam trajectory in the X- and Y-directions, in principle, the beam blur (expansion) varies in the X- and Y-direction.

In this case, the beam blurs in the X- and Y-directions is adjusted by the lens voltage applied to each quadrupole lens. That is, in the electron beam optical system using the quadrupole lenses, the beam blur differs in the X- and Y-directions, but in the case of astigmatism adjustment, the same correction voltage may be applied uniformly to the lens of one stage, out of four stages of quadrupole lenses.

Figure 2:
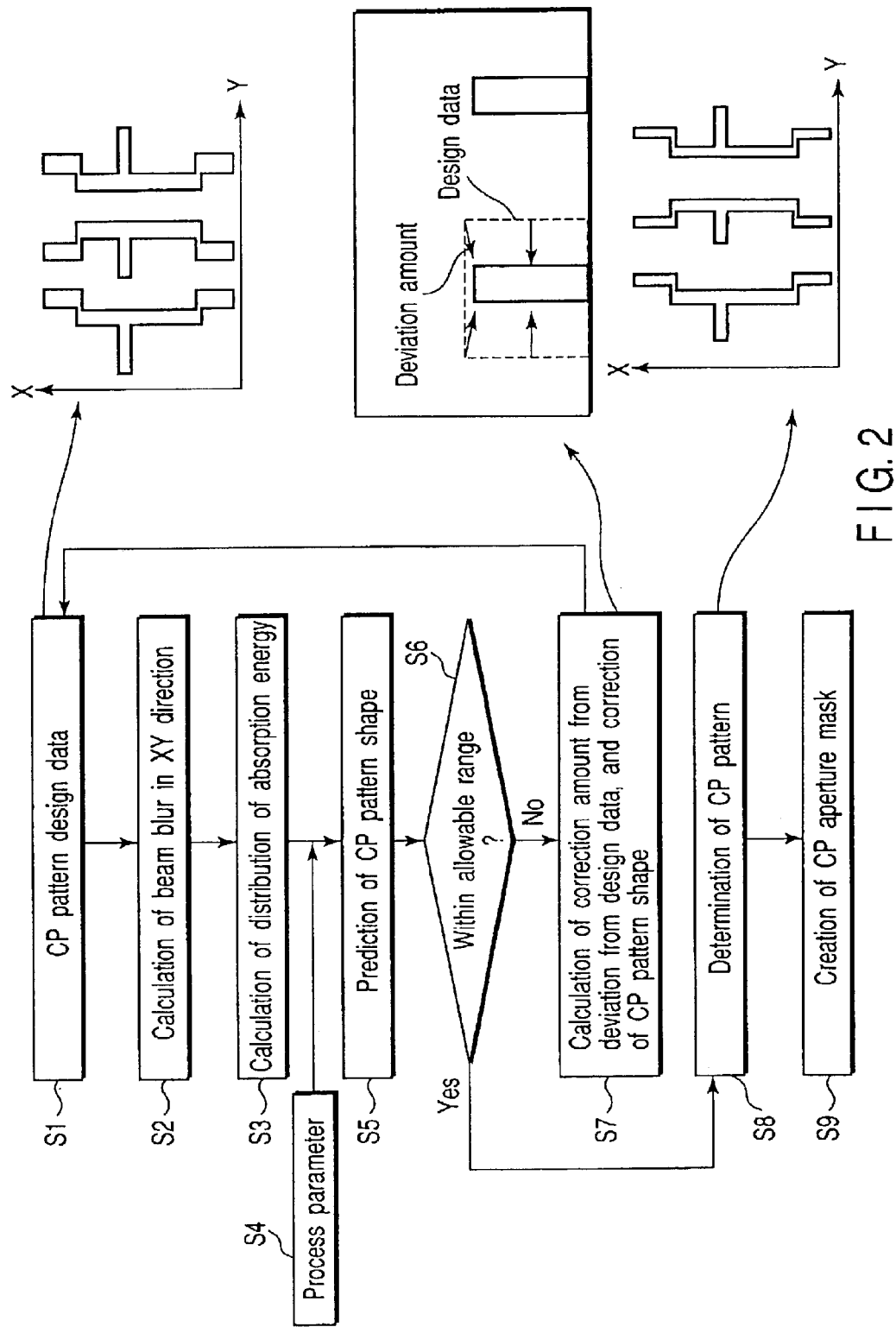
FIG. 2 shows a processing procedure of a shape correction method according to the first embodiment.

A method of forming the CP aperture mask 7 of the embodiment will be described. FIG. 2 is a flow chart showing a processing procedure of a shape correction method of the invention. Herein, as a CP pattern of the CP aperture mask 7 to which the embodiment is applied, a gate pattern is explained as an example of a pattern for composing a logic circuit.

(1) First, using design data of the CP pattern, the beam blurs in the X- and Y-directions are set separately by computer simulation (S1, S2). Herein, the beam blur in the X-direction is set smaller and the beam blur in the Y-direction is set larger.

(2) Coordinates of the gate pattern are converted such that the line width direction of the gate pattern (design data) coincides with the X-direction on the simulator.

(3) Further, concerning the gate pattern (design data), using the beam blurs in the X- and Y-directions set in (1), the absorption energy distribution of a resist on the wafer is estimated by Gaussian convolution process (S3), and using the absorption energy distribution ad process parameter (S4), the gate pattern shape (CP pattern shape) of the wafer (sample) surface is predicted (S5). The process parameter is the parameter to be controlled when forming a resist pattern on the wafer, such as resist film thickness, developing time, and ambient temperature during development.

(4) It is decided whether or not the predicted CP pattern shape settles within the allowable range (S6). If settling (approved), go to process (8), and if not settling (rejected), go to process (5).

(5) When rejected at (4), determine the deviation between the predicted CP pattern shape and the design data, and calculate the optimum exposure amount for settling the predicted CP pattern shape within an allowable range.

(6) The correction amount determined in (5) is added to the original gate pattern (design data), and the gate pattern shape (CP pattern shape) is corrected (S7).

(7) On the basis of the gate pattern (design data) determined in (6), repeat processes (1) to (4).

(8) Using the gate pattern (S8) approved at (4), make the CP aperture mask 7 including the gate pattern.

Herein, an example of a gate pattern is used for explaining the CP pattern of shape correction for eliminating the effect of anisotropy of the beam blurs in X- and Y-directions, but the CP pattern 8 on the CP aperture mask 7 of the exposure apparatus shown in FIG. 1 have been all corrected in shape in the processes of (1) to (8).

The exposure method using the exposure apparatus of the embodiment will be explained. Herein, exposure of a gate pattern of a logic circuit will be explained.

(1) First, in order to obtain a higher resolution, the beam blurs are set separately in the X- and Y-directions. Herein, the beam blur in the X-direction is set smaller and the beam blur in the Y-direction is set larger.

(2) Next, in order to match the gate line width direction and X-direction in the exposure apparatus, the direction of the wafer 11 is adjusted outside of the exposure apparatus, and then the wafer 11 is conveyed into the exposure apparatus.

In the exposure apparatus, in the case of the exposure apparatus having a mechanism capable of matching the gate line width direction and X-direction, the direction of the wafer 11 may be adjusted in the exposure apparatus. As the mechanism for adjusting the direction of the wafer 11, for example, an XY stage may be considered, but an ordinary XY stage can adjust the direction (rotation angle) of the wafer 11 only in a small range. The gate line width direction and X-direction may be largely different in an initial stage. Therefore, to adjust the direction of the wafer 11 within the exposure apparatus, it is generally required to install a separate direction adjusting mechanism. It means an extra cost of the apparatus. Therefore, usually, the direction of the wafer 11 is preferred to be adjusted outside of the apparatus.

(3) Using the CP aperture mask 7 including the gate pattern corrected in shape, the gate pattern is exposed and projected onto the wafer conveyed into the exposure apparatus.

As a result of exposure in this manner, as compared with the prior art, the resolution of the gate pattern is enhanced. Although the beam blur is different in the X- and Y-directions, a desired gate pattern shape could be obtained. Herein, exposure of the gate pattern is explained, but same effects are obtained in the exposure of another CP pattern by using the CP aperture mask 7 including the CP pattern corrected in shape according to this embodiment.

As described herein, according to the embodiment, by using the CP aperture mask 7 prepared in consideration of the beam blurs in the X- and Y-directions, the dependence of the beam blur of the electron beam on the directivity is reduced, so that the pattern may be transferred at high precision on the wafer 11.

Figure 3:
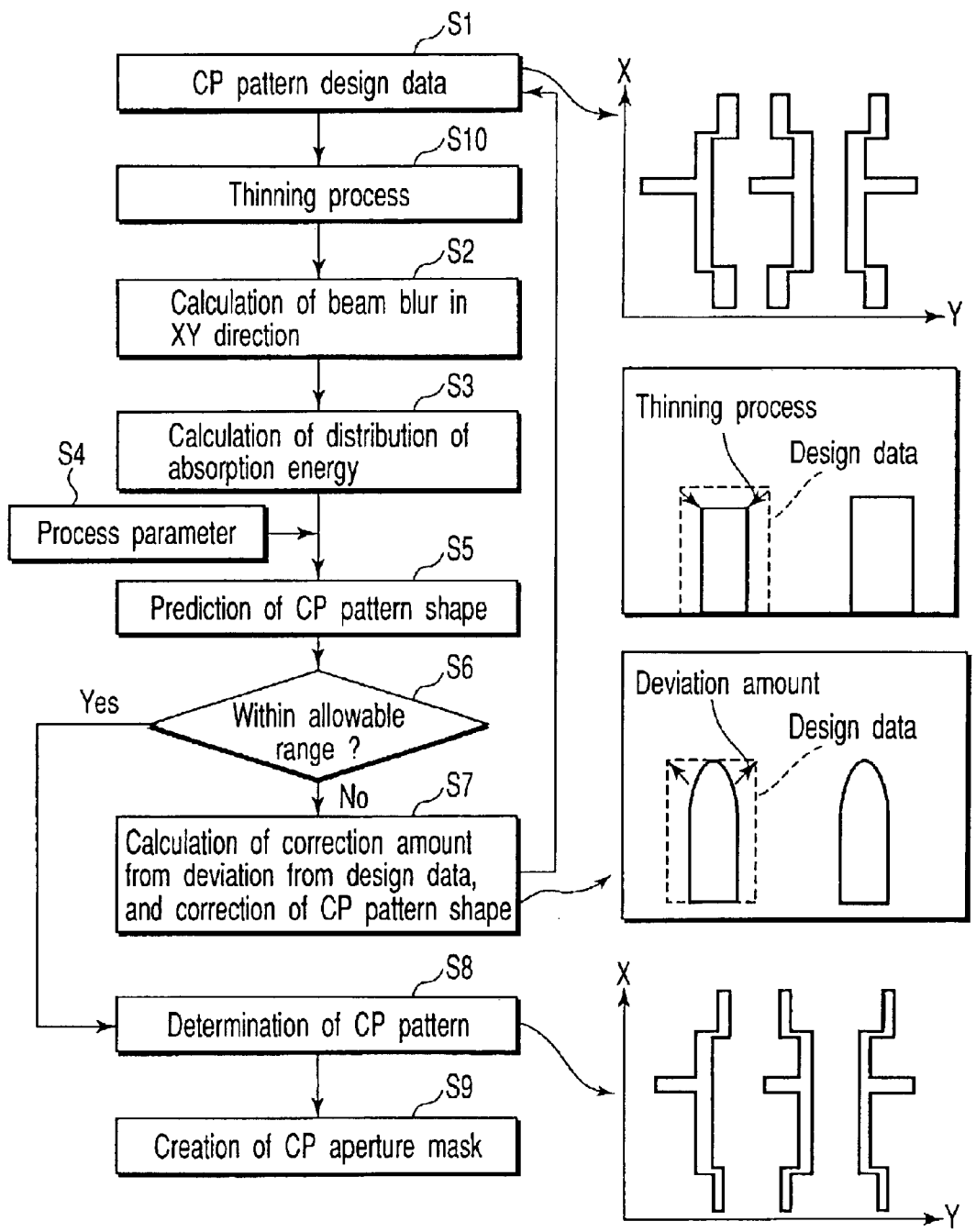
FIG. 3 is explains a modified example of the first embodiment.

FIG. 3 shows a modified example of the embodiment. What differs between this modified example and the embodiment lies in the reducing process (S10) of the design data of the CP pattern and execution of the process from (1) to (8) by using the reduced data.

Using the CP aperture mask obtained in the modified example, when exposing the gate pattern on the wafer conveyed into the exposure apparatus, the exposure amount is set larger than in the embodiment. It is because the gate line width must be adjusted to a proper size because the CP pattern has been reduced. The effect of the reducing process is explained later.

(Second Embodiment)

Figure 4A:
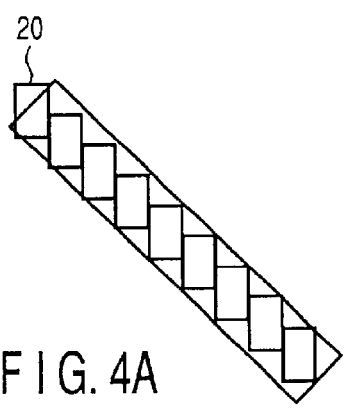
FIG. 4A to FIG. 4C are diagrams explaining a method of forming an oblique line pattern according to a second embodiment of the present invention.
Figure 4B:
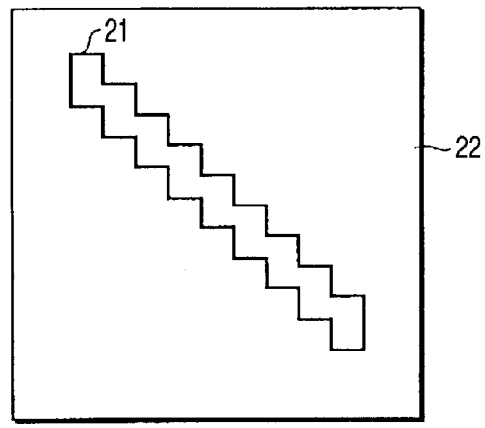
Figure 4C:
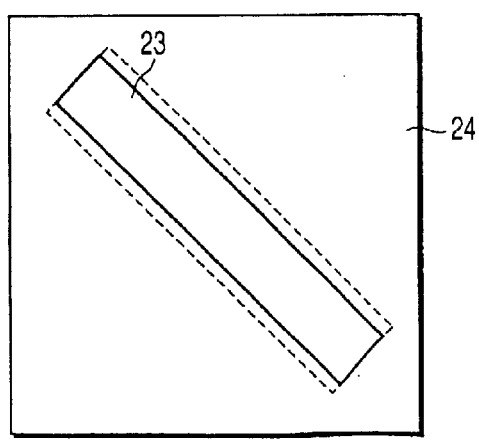

FIG. 4A to FIG. 4C are diagrams explaining a method of forming an oblique line pattern according to a second embodiment of the invention.

When forming a 45-degree oblique line by using a square beam, exposure is carried out as shown in FIG. 4A. Considering the beam blur of square beam 20 in the X- and Y-directions such that the width of the 45-degree oblique line may be a designed value, the aspect ratio of square beam 20 in the X- and Y-directions is set, and exposure is carried out while stepping the square beam 20 in a 45-degree direction. Meanwhile, the X-direction is the lateral direction in the diagram, and the Y-direction is a vertical direction in the drawing, being perpendicular to the X-direction (same in the following description).

To securely prevent occurrence of gap between the square beams 20, when stepping while overlapping the square beam 20, the aspect ratio of the square beam 20 in the X- and Y-direction is set in consideration of the overlap quantity.

Thus, by setting the aspect ratio of the square beam 20 in the X- and Y-directions, if there is anisotropy in the beam blurs in the X- and Y-directions, and 45-degree oblique line can be formed with high precision.

When forming a 45-degree oblique line by CP exposure, a CP aperture mask as shown in FIG. 4B is used. That is, it is intended to use a CP aperture mask 22 having an opening 21 in the pattern configuration same as the shot position pattern of the square beam 20 in FIG. 4A.

By using the CP aperture mask 22 having the opening 21 in consideration of the beam blurs in the X- and Y-directions, the 45-degree oblique line can be formed with high precision.

When using an oblique line aperture mask, too, by using an oblique line aperture mask 24 having an opening 23 adjusted in line width in consideration of the beam blurs in the X- and Y-directions as shown in FIG. 4C, a 45-degree oblique line can be formed with high precision. In FIG. 4C, the dotted line shows the opening formed without consideration to the beam blurs in the X- and Y-directions.

Herein, the 45-degree oblique line is explained, but an oblique line other than 45 degrees can be also formed in precisely the same method.

(Third Embodiment)

Figure 5A:
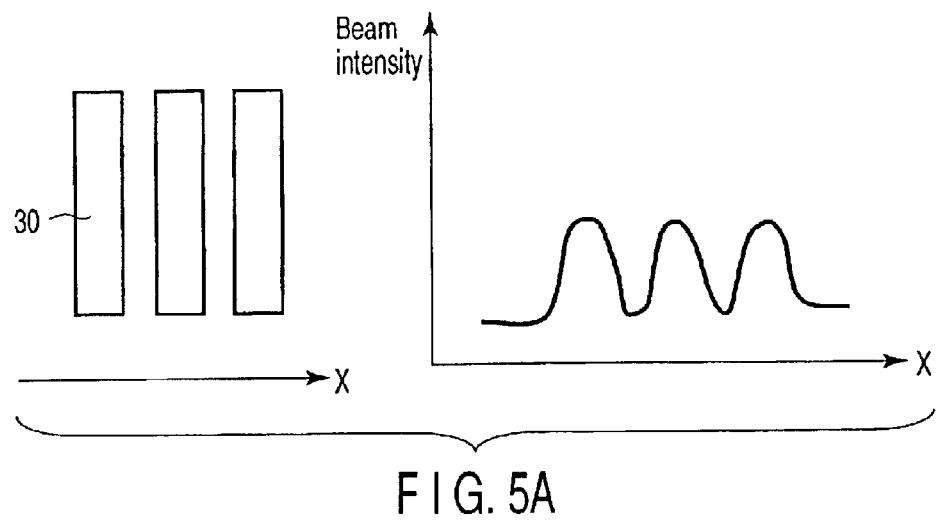
FIG. 5A to FIG. 5C are diagrams explaining an exposure method according to a third embodiment of the present invention.
Figure 5B:
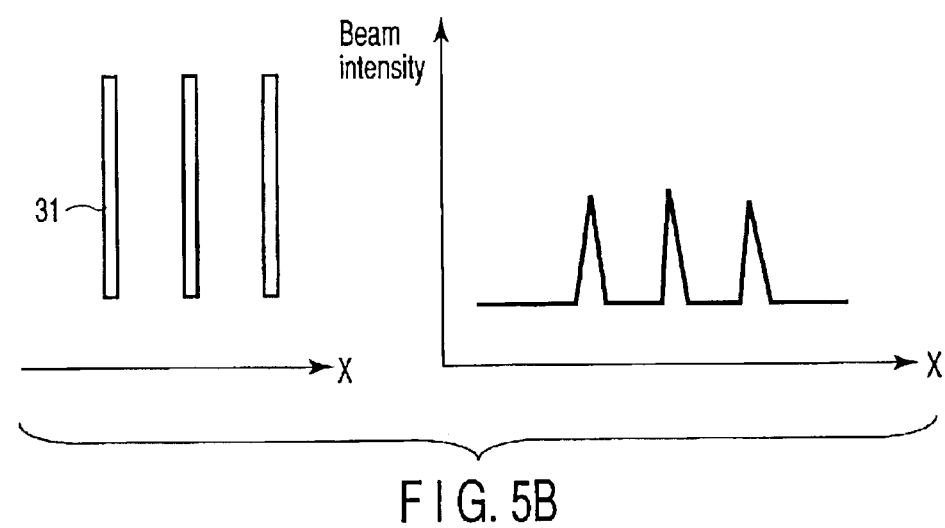
Figure 5C:
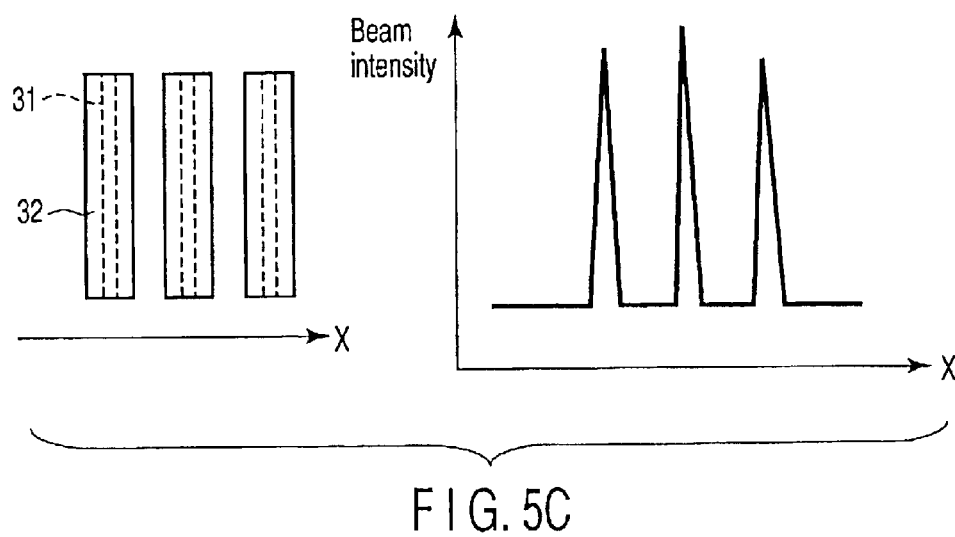

FIG. 5A to FIG. 5C are diagrams explaining an exposure method according to a third embodiment of the invention. This is to explain an EB exposure method using a CP aperture mask processed by thinning.

FIG. 5A shows a conventional CP pattern (original diagram) 30 without thinning process and the beam intensity distribution on the wafer (sample) using it.

In this embodiment, as shown in FIG. 5B, the CP pattern (original diagram) is thinned in the X-direction, and the obtained CP pattern 31 is used. In this case, when the pattern is formed in the same exposure amount as in the prior art, the beam intensity is weaker on the wafer by the thinned portion, and the pattern width on the wafer is narrower.

Accordingly, in the embodiment, as shown in FIG. 5C, by heightening the peak value of the beam intensity and increasing the exposure amount than conventional method, a pattern 32 is formed on the wafer exactly in the designed size.

Preferably, the pattern width of the CP pattern 31 should be as narrow as possible, and the EB beam current (beam current) emitted on the wafer should be sufficiently small. As a result, the beam blur can be effectively decreased. Hence, by increasing the exposure amount, the pattern can be adjusted to an appropriate dimension.

As a result, if the pattern density is high, the beam resolution is high, and surface roughness of the resist pattern can be decreased, and the pattern can be projected onto the wafer with high precision.

This is an example of a square pattern, but the beam blur can be decreased by the same technique by other pattern, and the pattern can be projected onto the wafer with high precision.

(Fourth Embodiment)

Figure 6A:
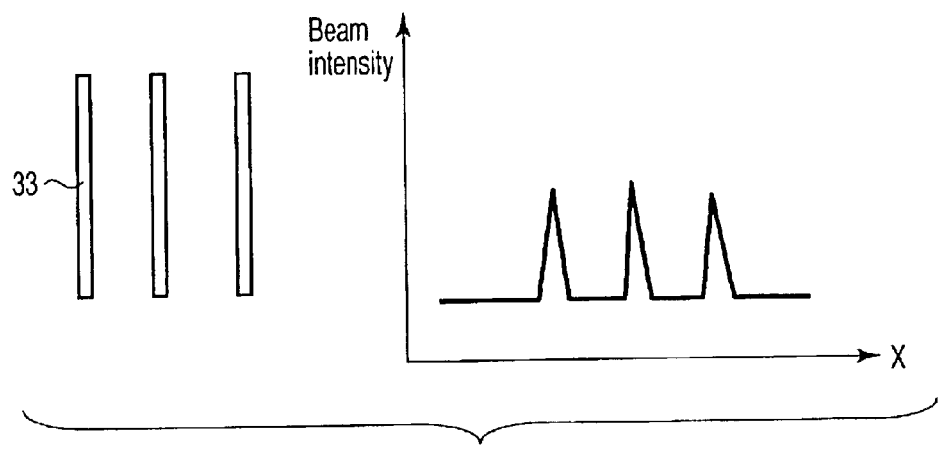
FIG. 6A to FIG. 6C are diagrams explaining an exposure method according to a fourth embodiment of the present invention.
Figure 6B:
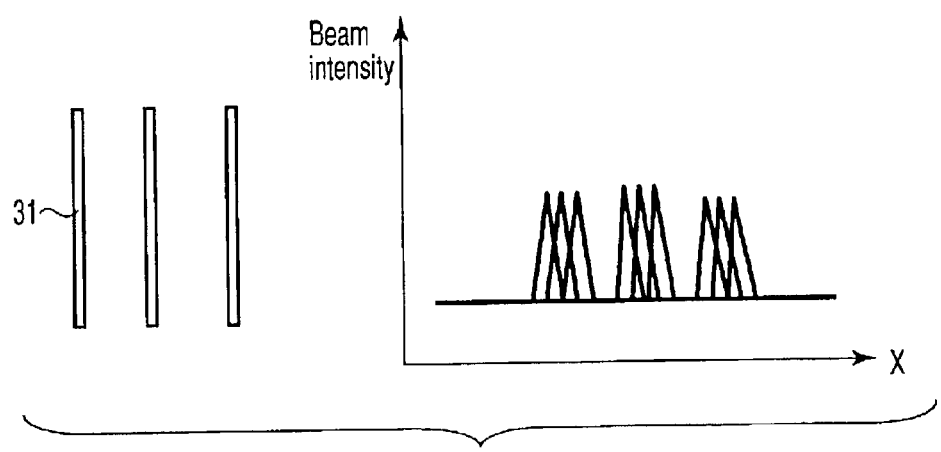
Figure 6C:
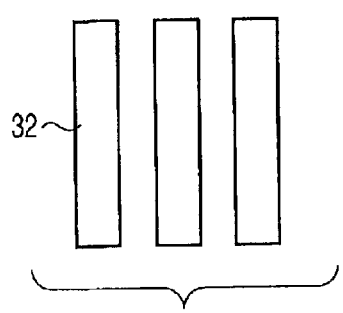

FIG. 6A to FIG. 6C are diagrams explaining an exposure method according to a fourth embodiment of the invention. This is to explain another exposure method using the CP aperture mask processed by thinning.

FIG. 6A shows a pattern 33 on the wafer by exposing the CP pattern 31 of FIG. 5B and the beam intensity distribution. The dimension of the pattern 33 in the X-direction is smaller than the design value.

In this embodiment, as shown in FIG. 6B, the CP pattern 31 is scanned in the X-direction by using the deflector (for example, deflector 6 in FIG. 1) on the wafer, and the exposure amount is more than before. Herein, the CP pattern 31 is an electron beam formed by the CP pattern 31. Therefore, as shown in FIG. 6C, a pattern 32 exactly in the designed size can be formed on the wafer.

In this embodiment too, the pattern width of the CP pattern 31 should be as narrow as possible, and the beam current emitted on the wafer should be sufficiently small. As a result, the beam blur can be effectively decreased. Hence, by scanning electron beam 34 in the X-direction, the pattern can be adjusted to an appropriate dimension.

In this embodiment, the same effects as in the third embodiment can be obtained. Same as in the third embodiment, moreover, this embodiment is also effective for pattern other than a square pattern. In the embodiment, in order to obtain an appropriate dimension of the pattern, the electron beam 34 is scanned in the X-direction (thinning direction), but multiple exposure may be executed by deviating the CP pattern 31 in the X-direction.

(Fifth Embodiment)

FIG. 7A to FIG. 7D are diagrams explaining an exposure method according to a fifth embodiment of the invention. This is to explain a different exposure method using the CP aperture mask processed by thinning.

In the third and fourth embodiments, the shape of the CP pattern is composed of line segments only. In this embodiment, the shape of the CP pattern is composed of line segments and squares.

Figure 7A:
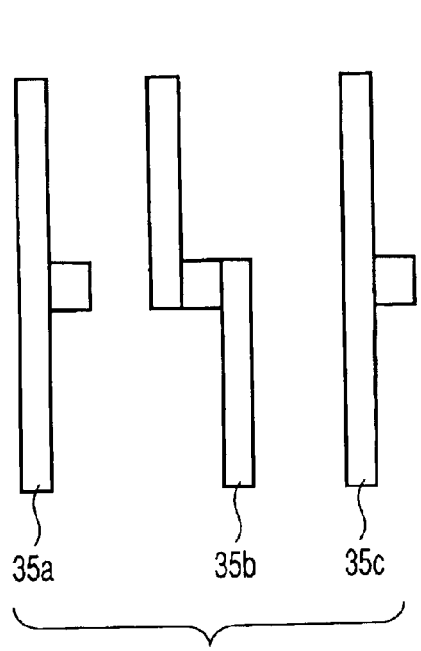
FIG. 7A to FIG. 7D are diagrams explaining an exposure method according to a fifth embodiment of the present invention.

FIG. 7A shows conventional CP patterns 35a to 35c. The CP patterns 35a to 35c are composed of one opening each.

Figure 7B:
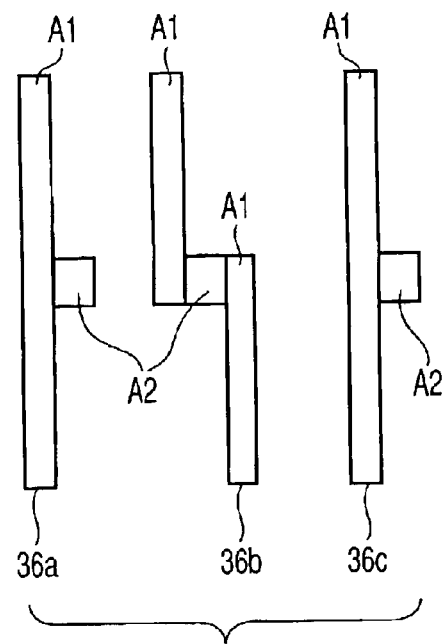

In this embodiment, as shown in FIG. 7B, patterns 36a to 36c to be formed on the wafer are divided into line portions (edge portions) A1 and square portions (central portions) A2.

Figure 7C:
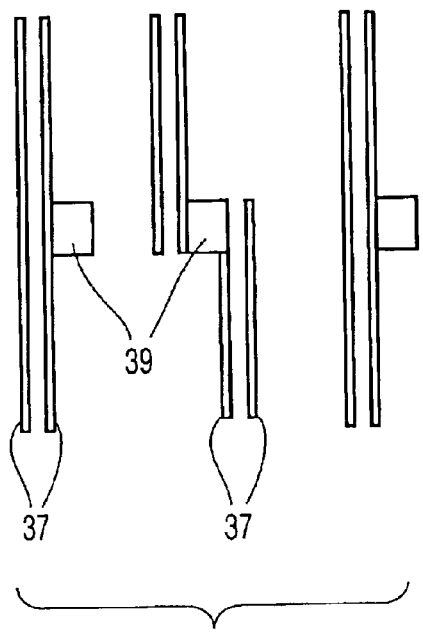
Figure 7D:
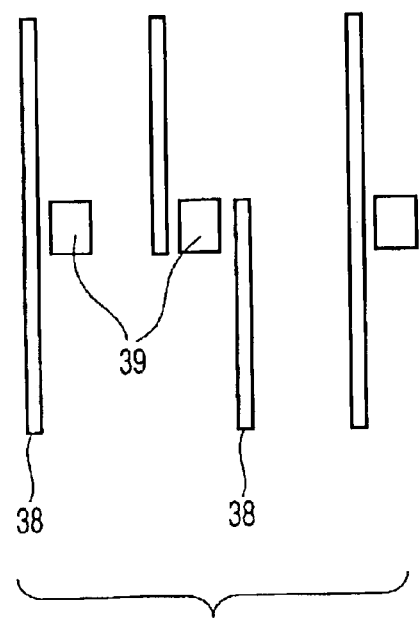

The line portion A1 is formed of two linear CP patterns (openings) 37 as shown in FIG. 7C, or one liner pattern (opening) 38 as shown in FIG. 7D. The pattern width of the CP patterns 37, 38 is preferred to be as thin as possible same as in the case of the third or fourth embodiment. On the other hand, the square portion A2 is composed of a square CP pattern (opening) 39. The opening width of the CP pattern 39 is larger than that of the CP patterns 37, 38.

A pattern is projected by exposure using the CP aperture mask including the CP pattern shown in FIG. 7C or FIG. 7D. At this time, the CP patterns 37, 38 are exposed according to the method of the third or fourth embodiment, and the dimension is obtained exactly as designed.

When exposed in this manner, in the region corresponding to the line portion (edge portion) A1, the beam current is smaller on the wafer, and the beam blur can be decreased. As a result, the beam resolution is improved, and the pattern can be projected onto the wafer with high precision.

(Sixth Embodiment)

Figure 8:
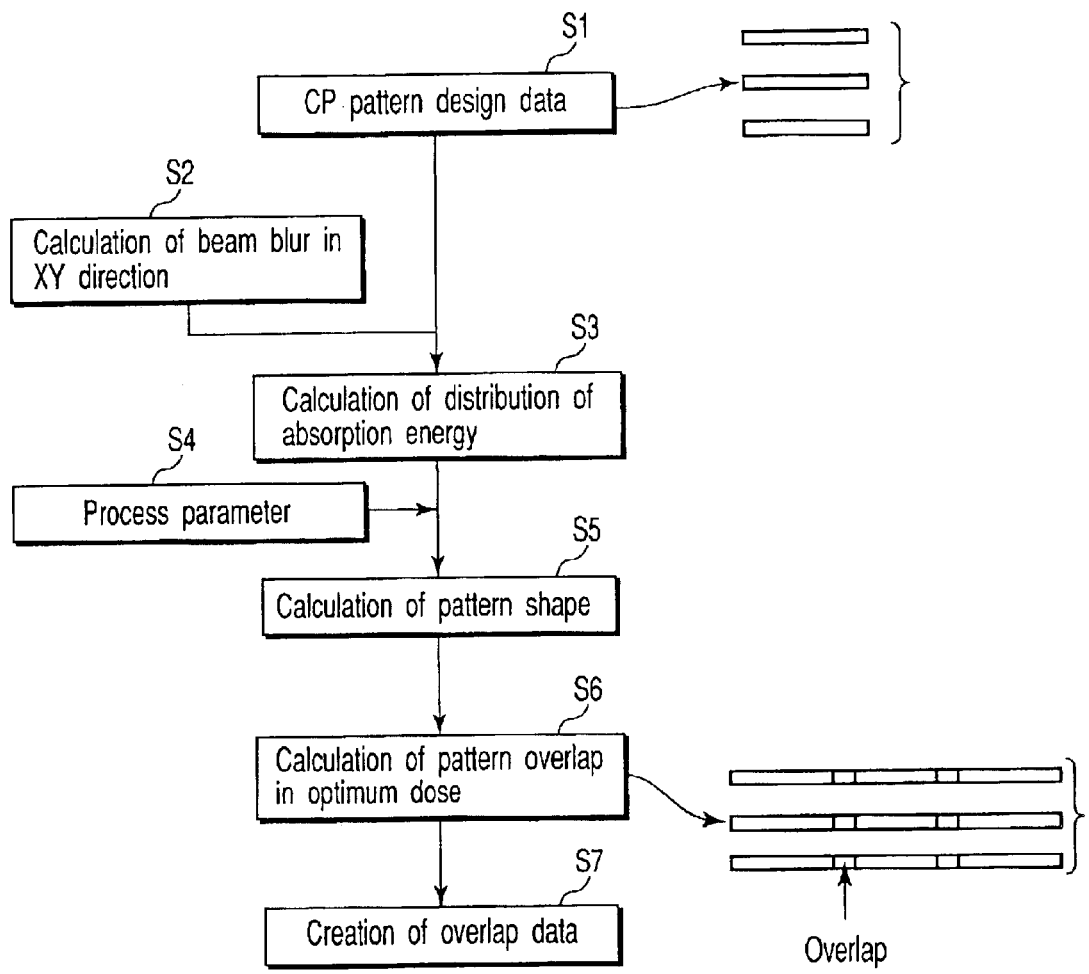
FIG. 8 is a flow chart showing a processing procedure of a method of making overlap data of a CP wiring pattern according to a sixth embodiment of the present invention.

In this embodiment, using CP exposure, a method of forming a wiring pattern in one desired dimension by linking plural wiring patterns is explained. FIG. 8 shows a processing procedure of a method of making overlap data of a wiring pattern of the embodiment.

(1) First, using design data of the CP pattern, the beam blurs in the X- and Y-directions are set separately by computer simulation (S1, S2).

(2) Next, using the beam blurs in the X- and Y-directions, predetermined specific exposure amount, and wiring CP pattern (design data), the absorption energy distribution of the resist on the wafer is estimated by computer simulation (S3). The predetermined specific exposure amount is an exposure amount not considering the beam blur in the X- and Y-direction.

(3) Using the absorption energy distribution (S3) and process parameter (S4), the shape and dimension of the wiring pattern on the wafer are approximated. The pattern shape and dimension obtained herein are the results of exposing the resist by the predetermined specific exposure amount, and hence are not always same as the desired pattern shape and dimension.

(4) Consequently, estimating the exposure amount (optimum exposure amount) for obtaining the desired pattern shape and dimension, the shape and dimension of the wiring pattern on the wafer by using the optimum exposure amount are calculated by using the shape and dimension of the wiring pattern obtained in (3) (S5).

Meanwhile, if the optimum exposure amount is estimated before (2) and when using the simulator capable of calculating the shape and dimension of the wiring pattern on the wafer by using the optimum exposure amount from the beginning, the process (4) is not needed, and the process (3) is directly followed by the process of (5) below.

(5) On the basis of the shape and dimension of the wiring pattern determined at (4), the overlap amount of the wiring pattern on the wafer is calculated (S6), and the overlap data of the CP wiring pattern for use in exposure is created (S7).

FIG. 9A to FIG. 9D are diagrams explaining an exposure method of the embodiment using the overlap data. Below is explained a case of linking two wiring patterns (first and second wiring patterns) and forming one wiring pattern with a desired dimension (a wiring pattern having three wirings disposed in the vertical direction).

(1) First, the beam blurs in the X- and Y-directions are set separately. As a result, a high resolution is obtained. Herein, the beam blur is set smaller in the Y-direction corresponding to the line width direction of the wiring pattern, and the beam blur is set larger in the X-direction corresponding to the linking direction of the shot patterns.

(2) The direction of the wafer is determined so that the line width direction of one wiring pattern with a desired dimension and the X-direction may coincide with each other, and the wafer is conveyed into the exposure apparatus.

(3) On the basis of the drawing data and overlap data, an electron beam pattern (first electron beam pattern) corresponding to the first wiring pattern is formed, and the first electron beam pattern is emitted to a predetermined position on the wafer. In succession, on the basis of the drawing data and overlap data, an electron beam pattern (second electron beam pattern) corresponding to the second wiring pattern is formed, and the second electron beam pattern is emitted to a predetermined position on the wafer.

At this time, the first electron beam pattern and second electron beam pattern are designed to be linked by a specific overlap quantity, so that the electron beam pattern corresponding to one wiring pattern with a desired dimension (a composite beam pattern of the first electron beam pattern and second electron beam pattern) may be emitted on the wafer.

Figure 9A:
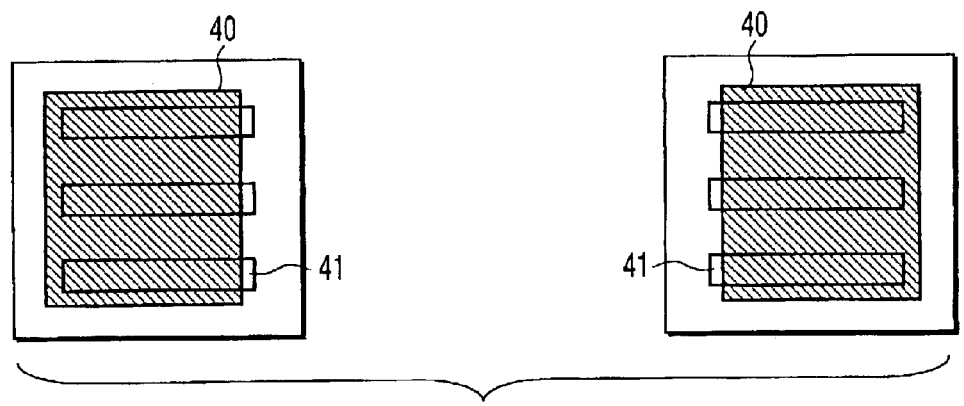
FIG. 9A to FIG. 9D are diagrams explaining an exposure method according to the sixth embodiment.

Specifically, as shown at the left side in FIG. 9A, an electron beam 40 having passed through the first aperture mask is emitted to a CP wiring patter (opening) 41 on the CP aperture mask (second aperture), and a first electron beam pattern is formed.

At this time, in order that the irradiation position (beam position) of the electron beam 40 on the CP wiring pattern 41 may be as follows, the deflection amount of the electron beam 40 is controlled by the deflector (not shown) (specifically the deflector 6 or 10 in FIG. 1), while the size of the electron beam 40 is controlled by the lens (not shown) (for example, lens 9 in FIG. 1).

That is, the electron beam 40 is controlled as follows: one end (left end in this example) of the electron beam 40 is positioned outside of one end (left end in this example) of the CP wiring pattern 41, and the other end (right end in this example) of the electron beam 40 is positioned inside of the other end (right end in this example) of the CP wiring pattern 41 by a predetermined amount.

This predetermined amount is the amount determined by the dimension in the longitudinal direction (wiring longitudinal direction) of the first electron beam pattern considering the overlap. One end of the CP wiring pattern 41 corresponds to one end of the one wiring pattern with a desired dimension, and the other end of the CP wiring pattern 41 corresponds to the linking portion of the two wiring patterns.

Herein, relating to the lateral direction (X-direction), there is a region which is not irradiated with the first electron pattern beam at the right end of the CP wiring pattern 41. In the vertical direction (Y-direction), however, there is no region which is not irradiated with the first electron pattern beam.

Next, as shown at the right side in FIG. 9A, the electron beam 40 having passed through the first aperture mask is emitted to the CP wiring pattern 41 on the CP aperture mask, and a second electron beam pattern is formed.

At this time, the electron beam 40 is controlled same as mentioned above such that the irradiation position of the electron beam 40 on the CP wiring pattern 41 may be as follows.

That is, the electron beam 40 is controlled as follows: one end (right end in this example) of the electron beam 40 is positioned outside of one end (right end in this example) of the CP wiring pattern 41, and the other end (left end in this example) of the electron beam 40 is positioned inside of the other end (left end in this example) of the CP wiring pattern 41 by a predetermined amount.

This predetermined amount is the amount determined by the dimension in the longitudinal direction (wiring longitudinal direction) of the second electron beam pattern considering the overlap. One end of the CP wiring pattern 41 corresponds to the other end of the one wiring pattern with a desired dimension, and the other end of the CP wiring pattern 41 corresponds to the linking portion of the two wiring patterns.

Figure 9B:
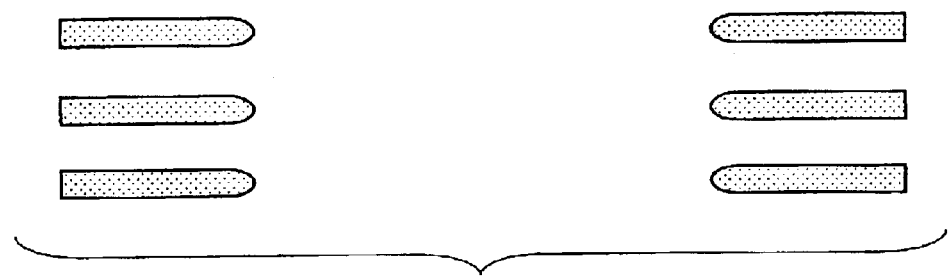

FIG. 9B shows the shape of the first and second beam patterns generated by emitting the electron beam 40 to the CP wiring pattern 41. As shown in FIG. 9B, beam blur occurs at the position corresponding to the linking portion of two wiring patterns, but a beam blur hardly occurs at the position corresponding to the end of one wiring pattern with a desired dimension.

Figure 9C:
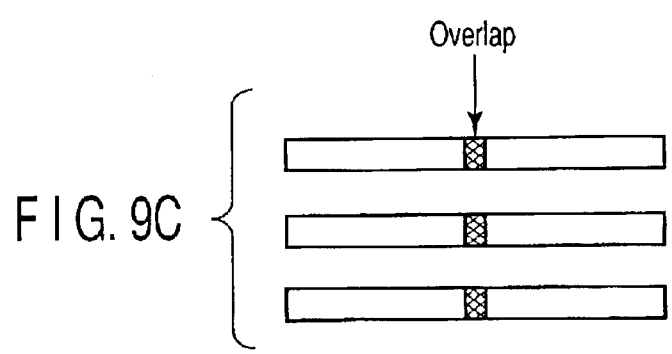

FIG. 9C shows a composite pattern of the first beam pattern and second beam pattern emitted on the wafer.

Figure 9D:
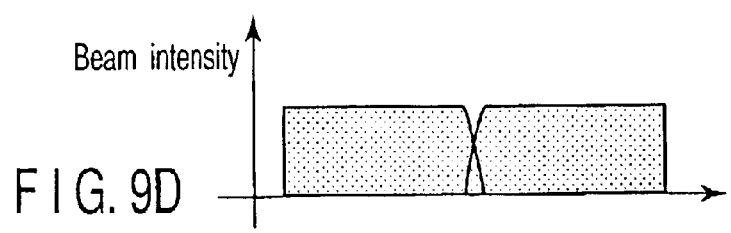

FIG. 9D shows beam intensity distribution of the first beam pattern and second beam pattern emitted on the wafer. The individual beam intensity of the linking portion of the first and second electron beam patterns is lower than the predetermined value due to the beam blur.

However, since the beam intensity of the linking portion of the composite pattern is the sum of the intensity of the linking portion of the first beam pattern and the intensity of the linking portion of the second beam pattern, and is hence a predetermined value. In other words, the beam intensity of the individual beam patterns in the linking portion is selected such that the sum of the beam intensity of individual beams of the linking portion may be a predetermined value.

Further, in the embodiment, since the direction of the large beam blur and the linking direction of the wiring pattern (wiring longitudinal direction) coincide with each other, if mismatching occurs in the wiring longitudinal direction to separate the first electron beam pattern and second electron beam pattern, wiring disconnection hardly occurs. That is, a wide margin is assured for shot position deviation.

(4) A resist pattern is formed by developing the wafer exposed by the first electron beam pattern and second electron beam pattern (to be precise, the resist on the wafer is exposed).

Figure 10A:
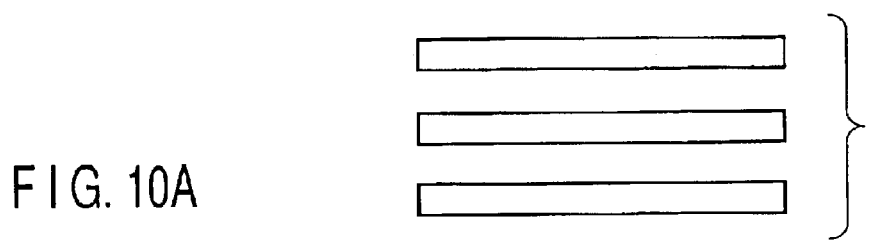
FIG. 10A and FIG. 10B are plan view and sectional view of a resist pattern formed by using the exposure method according to the sixth embodiment.
Figure 10B:

FIG. 10A is a plan view of the resist pattern, and FIG. 10B is a sectional view thereof. It is confirmed from FIG. 10 to be capable of forming a resist pattern of high precision showing a sharp edge shape at the end and free from pattern defect in the linking portion.

(Seventh Embodiment)

This embodiment relates to a method of forming a wiring pattern with a desired dimension by using CP exposure and linking plural wiring patterns.

The sixth embodiment relates to the method of forming a wiring pattern with a desired dimension by linking two wiring patterns, and this embodiment relates to a method of forming a wiring pattern with a desired dimension by linking three wiring patterns (first to third wiring patterns).

The overlap data is obtained in the same manner as in the sixth embodiment, and a method of making the data is omitted herein.

FIG. 12A to FIG. 12D are diagrams explaining the exposure method of the embodiment using the overlap data.

(1) First, the beam blurs in the X- and Y-directions are set separately. As a result, a high resolution is obtained. Herein, the beam blur is set smaller in the Y-direction corresponding to the line width direction of the wiring pattern, and the beam blur is set larger in the X-direction corresponding to the linking direction of the shot patterns.

(2) The direction of the wafer is determined such that the line width direction of one wiring pattern with a desired dimension and the X-direction may coincide with each other, and the wafer is conveyed into the exposure apparatus.

(3) On the basis of the drawing data and overlap data, an electron beam pattern (first electron beam pattern) corresponding to the first wiring pattern is formed, and the first electron beam pattern is emitted to a predetermined position on the wafer. In succession, on the basis of the drawing data 51 and overlap data, an electron beam pattern (second electron beam pattern) corresponding to the second wiring pattern is formed, and the second electron beam pattern is emitted to a predetermined position on the wafer.

At this time, the first electron beam pattern and second electron beam pattern are designed to be linked by a specific overlap quantity, so that the electron beam pattern corresponding to one wiring pattern with a desired dimension (a composite beam pattern of the first electron beam pattern and second electron beam pattern) may be emitted on the wafer.

Figure 12A:
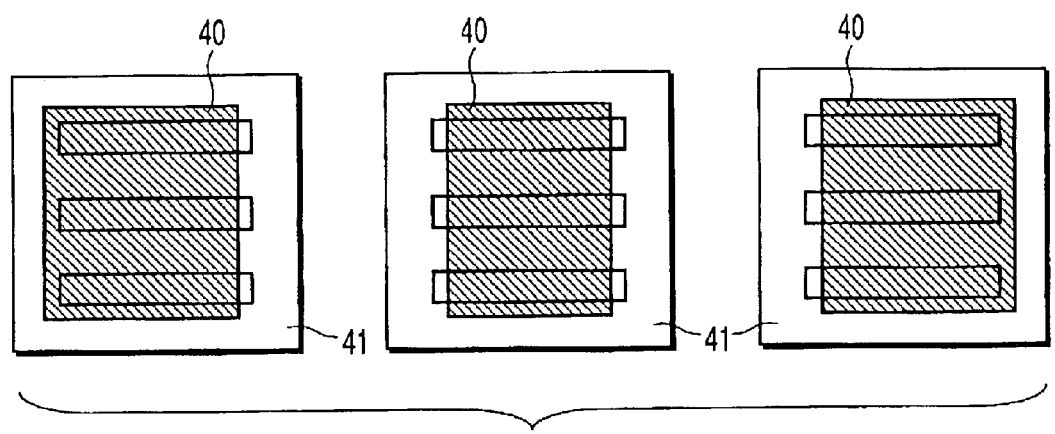
FIG. 12A to FIG. 12D are explanatory diagrams of an exposure method according to a seventh embodiment of the present invention.

Specifically, as shown at the left side in FIG. 12A, the electron beam 40 having passed through the first aperture mask is emitted to the CP wiring pattern 41 on the CP aperture mask, and a first electron beam pattern is formed.

At this time, in order that the irradiation position of the electron beam 40 on the CP wiring pattern 41 may be as follows, the electron beam 40 is controlled by the deflector and lens (not shown).

That is, the electron beam 40 is controlled in the deflection amount and beam size as follows: one end of the electron beam 40 is positioned outside of one end of the CP wiring pattern 41, and the other end of the electron beam 40 is positioned inside of the other end of the CP wiring pattern 41 by a predetermined amount.

This predetermined amount is the amount determined by the dimension in the longitudinal direction (wiring longitudinal direction) of the first electron beam pattern considering the overlap. One end of the CP wiring pattern 41 corresponds to one end of the one wiring pattern with a desired dimension, and the other end of the CP wiring pattern 41 corresponds to the linking portion of the adjacent first wiring pattern and second wiring pattern.

Herein, relating to the lateral direction (X-direction), there is a region which is not irradiated with the first electron pattern beam at the right end of the CP wiring pattern 41. In the vertical direction (Y-direction), however, there is no region which is not irradiated with the first electron pattern beam.

Next, as shown in the middle of FIG. 12A, the electron beam 40 having passed through the first aperture mask is emitted to the CP wiring pattern 41 on the CP aperture mask, and a second electron beam pattern is formed.

At this time, the electron beam 40 is deflected by the deflector and lens (not shown) such that the position of irradiation of the electron beam 40 on the CP wiring pattern 41 may be as follows.

That is, the electron beam 40 is controlled in the deflection amount and beam size as follows: one end of the electron beam 40 is positioned inside of one end of the CP wiring pattern 41 by a predetermined amount, and the other end of the electron beam 40 is positioned inside of the other end of the CP wiring pattern 41 by a predetermined amount.

These two predetermined amounts are the amounts determined by the dimension in the longitudinal direction (wiring longitudinal direction) of the second electron beam pattern considering the overlap. The both ends of the CP wiring pattern 41 correspond to the linking portion of the adjacent first and third wiring patterns at both sides.

Herein, relating to the lateral direction (X-direction), there is a region which is not irradiated with the second electron pattern beam at both right and left ends of the CP wiring pattern 41. In the vertical direction (Y-direction), however, there is no region which is not irradiated with the second electron pattern beam.

Next, as shown at the right side of FIG. 12A, the electron beam 40 having passed through the first aperture mask is emitted to the CP wiring pattern 41 on the CP aperture mask, and a third electron beam pattern is formed.

At this time, the electron beam 40 is deflected by the deflector and lens (not shown) such that the position of irradiation of the electron beam 40 on the CP wiring pattern 41 may be as follows.

That is, the electron beam 40 is controlled in the deflection amount and beam size as follows: one end of the electron beam 40 is positioned outside of one end of the CP wiring pattern 41, and the other end of the electron beam 40 is positioned inside of the other end of the CP wiring pattern 41 by a predetermined amount.

This predetermined amount is the amount determined by the dimension in the longitudinal direction (wiring longitudinal direction) of the third electron beam pattern considering the overlap. One end of the CP wiring pattern 41 corresponds to the other end of the wiring patter with a desired dimension, and the other end of the CP wiring pattern corresponds to the linking portion of the adjacent second wiring pattern and third wiring pattern.

Herein, relating to the lateral direction (X-direction), there is a region which is not irradiated with the third electron pattern beam at the left end of the CP wiring pattern 41. In the vertical direction (Y-direction), however, there is no region which is not irradiated with the third electron pattern beam.

Figure 12B:
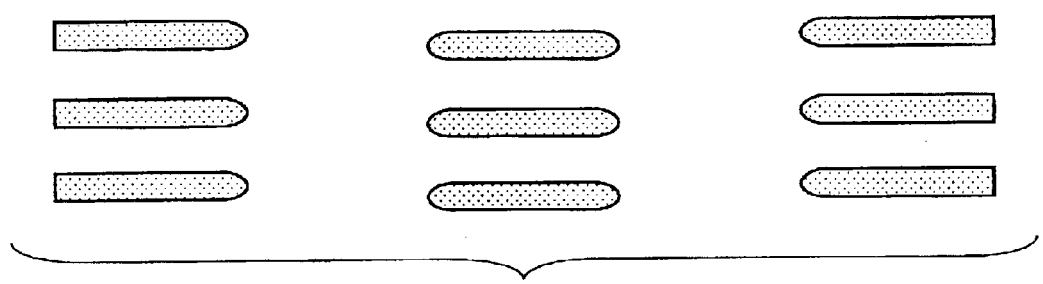

FIG. 12B shows the shape of the first to third beam patterns generated by emitting the electron beam 40 to the CP wiring pattern 41. As shown in FIG. 12B, the beam blur occurs at the position corresponding to the linking portion of the first wiring pattern and second wiring pattern, and the linking portion of the second wiring pattern and third wiring pattern, but the beam blur hardly occurs at the position corresponding to the end of one wiring pattern with a desired dimension.

Figure 12C:
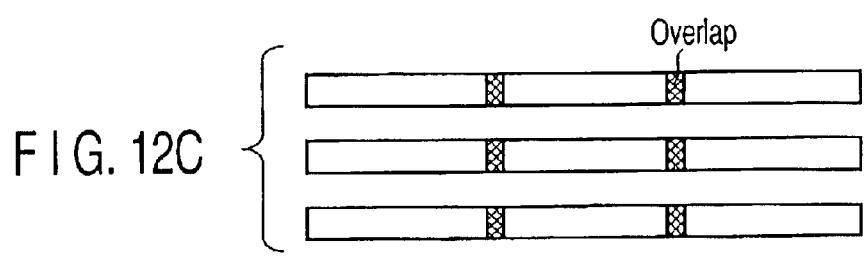

FIG. 12C shows a composite pattern of the first beam pattern, second beam pattern, and third beam pattern emitted on the wafer.

Figure 12D:
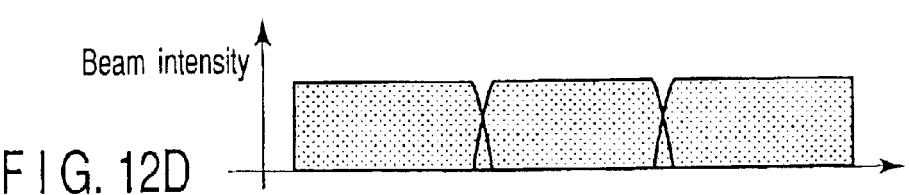

FIG. 12D shows beam intensity distribution of the first beam pattern to third beam patterns emitted on the wafer. The individual beam intensity of the linking portion of the first to third electron beam patterns is lower than the predetermined value due to the beam blur.

However, since the beam intensity of the linking portion of the composite pattern is the sum of the beam intensities of the linking portions of two adjacent beam patterns, and is hence a predetermined value. In other words, the beam intensity of the individual beam patterns in the linking portion is selected so that the sum of the beam intensities of individual beam patterns of the linking portions may be a predetermined value.

Further, in the embodiment, since the direction of the large beam blur and the linking direction of the wiring pattern (wiring longitudinal direction) coincide with each other, if mismatching occurs in the wiring longitudinal direction to separate the two adjacent electron beam patterns, wiring disconnection hardly occurs. That is, a wide margin is assured for shot position deviation.

(4) A resist pattern is formed by developing the wafer exposed by the first to third electron beam patterns (to be precise, the resist on the wafer is exposed).

Figure 13A:
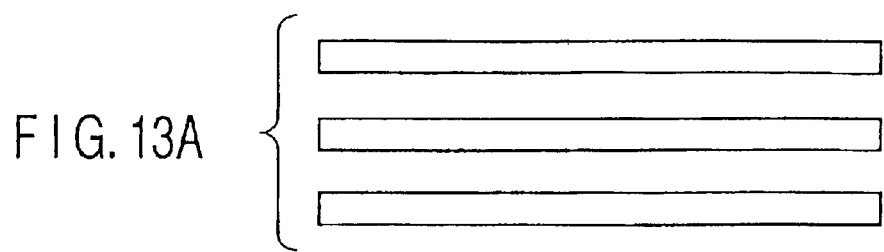
FIG. 13A and FIG. 13B are plan view and sectional view of a resist pattern formed by using the exposure method according to the seventh embodiment.
Figure 13B:

FIG. 13A is a plan view of the resist pattern, and FIG. 13B is a sectional view thereof. It is confirmed from FIG. 13A and FIG. 13B to be capable of forming a resist pattern of high precision showing a sharp edge shape at the end and free from pattern defect in the linking portion also when forming a longer wiring pattern than the wiring pattern of FIG. 10 by linking three electron beam patterns.

(Eighth Embodiment)

This embodiment relates to a method of forming a wiring pattern with a desired dimension by using CP exposure and linking plural wiring patterns. FIG. 14A to FIG. 14D are diagrams corresponding to FIG. 12A to FIG. 12D of the seventh embodiment. FIG. 13A and FIG. 13B of the seventh embodiment are similarly applicable to this embodiment.

Like the seventh embodiment, this embodiment is also intended to form a wiring pattern with a desired dimension by linking three wiring patterns, but differs from the seventh embodiment in the following points.

That is, the second electron beam pattern is deviated in the point of astigmatism in the connecting direction (X-direction), and the beam blur is set larger than in the seventh embodiment (FIG. 14A to FIG. 14D). By setting larger the beam blur of the second electron beam pattern, the electron beam 40 can be deflected such that the both ends of the first and second electron beams 40 may be positioned outside of the both ends of the CP wiring pattern 41 (FIG. 14A to FIG. 14D).

In this embodiment, too, same as in the seventh embodiment, it is possible to form a resist pattern of high precision, showing a sharp edge shape at the end, and free from pattern defect in the linking portion. The second electron beam pattern is generally a remaining electron beam pattern in which the two electron beam patterns corresponding to both ends of the wiring pattern with a desired dimension are removed.

(Ninth Embodiment)

This embodiment relates to a method of forming a wiring pattern with a desired dimension by using CP exposure and linking plural wiring patterns. FIG. 16A to FIG. 16D, and FIG. 17A and FIG. 17B are diagrams respectively corresponding to FIG. 12A to FIG. 12D, and FIG. 13A and FIG. 13B.

Like the seventh embodiment, this embodiment is also intended to form a wiring pattern with a desired dimension by linking three wiring patterns, but differs from the seventh embodiment in the following points.

Figure 16A:
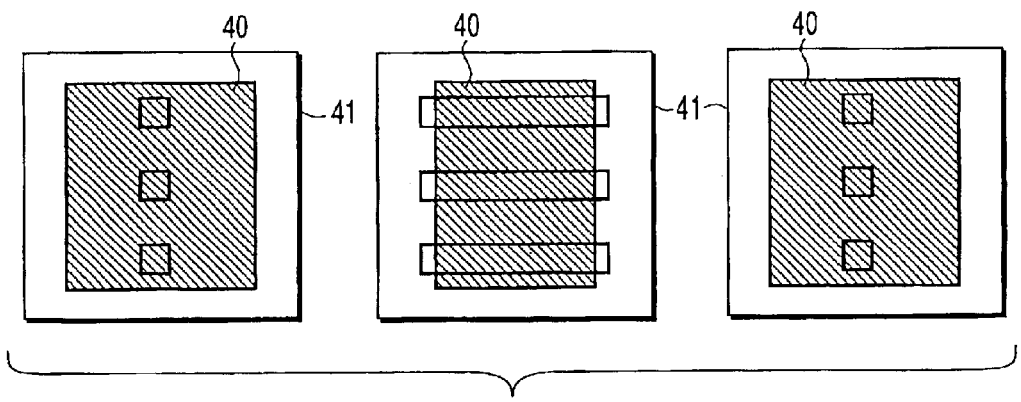
FIG. 16A to FIG. 16D are explanatory diagrams of an exposure method according to a ninth embodiment of the present invention.
Figure 16B:
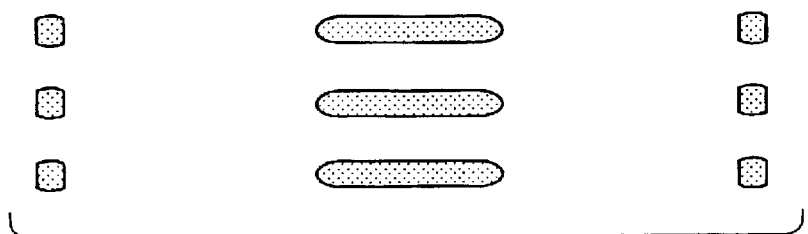

That is, the shape of the first and third electron beam patterns is the square shape (FIG. 16A to FIG. 16D). In this case, too, it is possible to form a resist pattern of high precision, showing a sharp edge shape at the end, and free from pattern defect in the linking portion (FIG. 17B and FIG. 17B). The first and third electron beam patterns are generally two electron beam patterns corresponding to both ends of the wiring pattern with a desired dimension.

Figure 11:
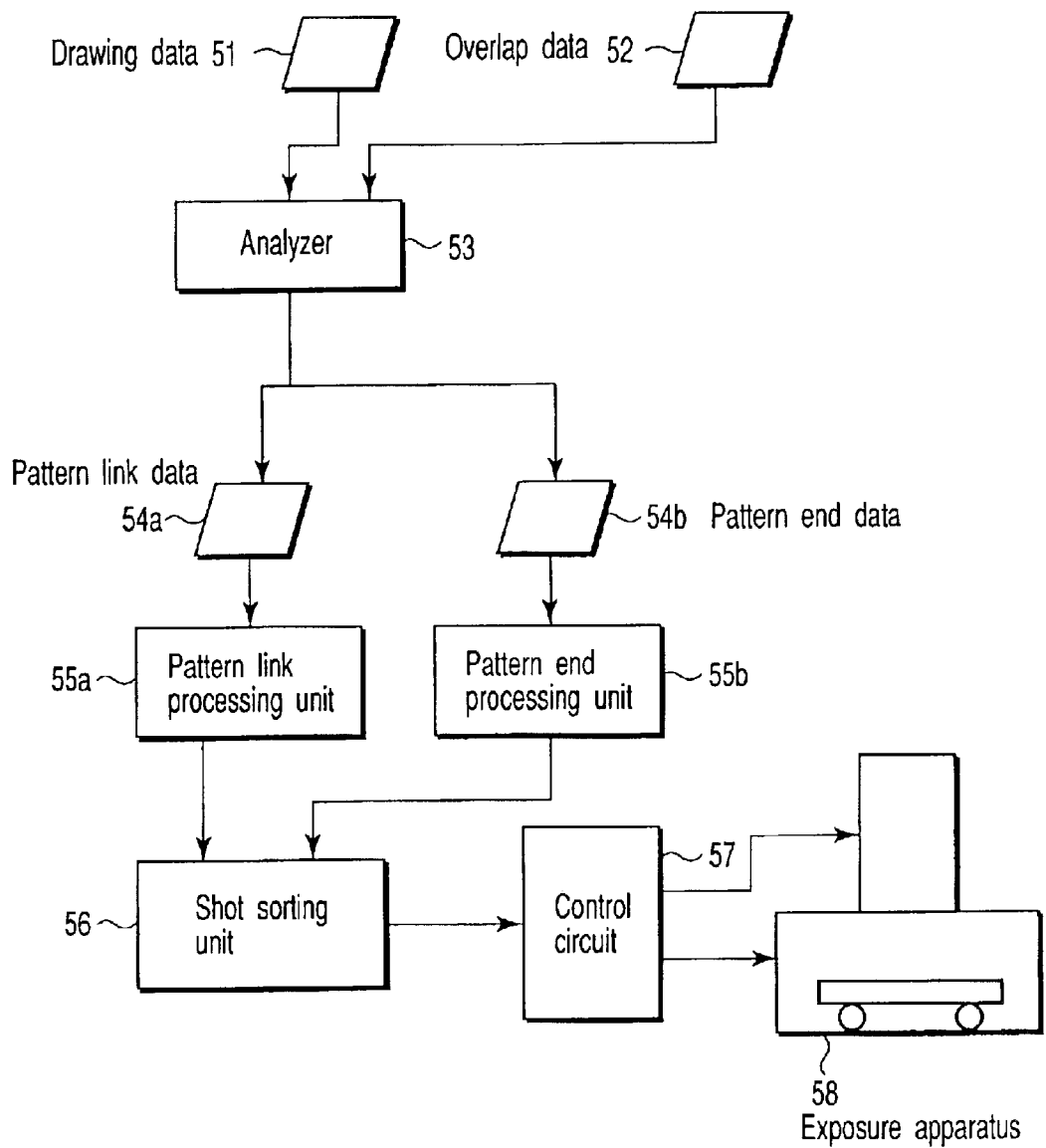
FIG. 11 is a schematic diagram of an exposure apparatus system for carrying out the exposure method according to the sixth embodiment.

FIG. 11 is a diagram schematically showing an exposure apparatus system for carrying out the exposure methods shown in the sixth to ninth embodiments. The exposure apparatus system of this embodiment is controlled by an exposure control program. The exposure control program is responsible for all control relating to exposure. Part of the exposure control program may be replaced by an exclusive hardware relating to the exposure.

The design data is input to a data converter including a data conversion program, and is converted into drawing data 51.

Herein, the design data is graphic data of an LSI pattern creased by using a CAD tool. Generally, the data format called GDS2 type is used. The drawing data 51 is data format exclusive for the electron beam exposure apparatus created by the data conversion program. The drawing data 51 is described in a format conforming to the specification of the electron beam exposure apparatus.

The drawing data 51 and overlap data 52 are stored in a storage unit (not shown). The storage unit is, for example, a semiconductor storage device such as DRAM. Of the drawing data 51 stored in the storage unit, the drawing data 51 selected by an operator is read into a data reading unit (not shown) in the frame unit. The data relating to the shot position in the drawing data 51 is converted into a data format of the type relating to the exposure apparatus, and read into the data reading unit.

The drawing data 51 and overlap data 52 read into the data reading unit are input to a shot analyzer 53 in the frame unit. The shot analyzer 53 analyzes the input drawing data 51, and classifies the data 51 into pattern link data and pattern end data.

The pattern link data 54a classified by the shot analyzer 53 is put into a pattern link processing unit 55a together with the overlap data 52. The overlap data 52 is determined by the preceding method. The pattern link processing unit 55a creates the data about the size of the beam to be ejected to the pattern link part on the basis of the pattern link data 54a and overlap data 52.

The pattern end data 54b classified by the shot analyzer 53 is put into a pattern end processing unit 55b together with the overlap data 52. The pattern end processing unit 55b creates data about the beam to be ejected to the pattern end part on the basis of the pattern end data 54b and overlap data 52.

For example, in the case of the sixth embodiment, in the shot analyzer 53, the two beams shown in FIG. 9B are processed as those corresponding to the pattern end data 54b. In this case, in order to avoid the beam blur at the pattern end part, the beam position on the CP aperture mask is set as shown in FIG. 9A. On the basis of the overlap data 52, the size of two beams shown in FIG. 9B is set such that the two beams can be projected in overlap onto the wafer as shown in FIG. 9C.

In the case of the seventh embodiment, in the shot analyzer 53, two right and left patterns out of three beams shown in FIG. 12B are processed as corresponding to the pattern end data 54b. The middle pattern is processed as corresponding to the pattern link data 54a. In this case, in the pattern corresponding to the pattern end data 54b, the beam position on the CP aperture mask is set as shown at the right and left sides in FIG. 12A so as to avoid the beam blur at the end part. The pattern corresponding to the pattern link data 54a is processed as shown in the middle in FIG. 12A, so that both ends of the beam may blur somewhat by setting the beam position on the CP aperture mask. On the basis of the overlap data 52, the size of three beams shown in FIG. 12B is set such that the three beams can be projected in overlap onto the wafer as shown in FIG. 12C.

In the eighth embodiment, the process is the same as in the seventh embodiment. That is, in the shot analyzer 53, two right and left patterns out of three beams shown in FIG. 14B are processed as corresponding to the pattern end data 54b. The middle pattern is processed as corresponding to the pattern link data 54a. In this case, in the pattern corresponding to the pattern end data 54b, the beam position on the CP aperture mask is set as shown at the right and left sides in FIG. 14A so as to avoid beam blur at the end part. As for the pattern corresponding to the pattern link data 54a, as shown in the middle in FIG. 14A, the beam position is set on the CP aperture mask. As for the pattern corresponding to the pattern link data 54a, the astigmatism is set such that the beam both ends may blur somewhat.

In adjustment of astigmatism in exposure, a voltage is superposed on the deflection voltage applied to the deflector 10 shown in FIG. 1. For example, eight electrodes are divided into two groups of X- and Y-directions, and +5 V is applied to the electrodes of the X-direction, and −5 V is applied to the electrodes of the Y-direction, on the deflection voltage of the beam, so that the astigmatism can be adjusted in a short time. In another method, a voltage may be superposed on the lens voltage to be applied to the electrostatic lens. Further, on the basis of the overlap data 52, the size of the three beams shown in FIG. 14B is set such that the three beams can be projected in overlap onto the wafer as shown in FIG. 14C.

Figure 16C:
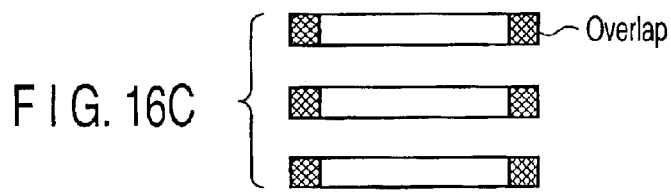
Figure 16D:
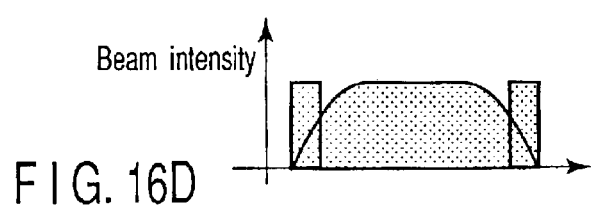
Figure 17A:
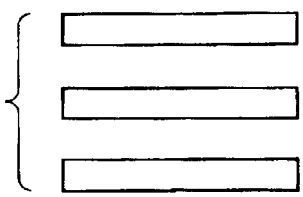
FIG. 17A and FIG. 17B are plan view and sectional view of a resist pattern formed by using the exposure method according to the ninth embodiment.
Figure 17B:

In the case of the ninth embodiment, in the shot analyzer 53, one pattern shown in FIG. 16C is divided into pattern end data 54b and pattern link data 54a. The divided patterns are further processed as being corresponding to the pattern end data 51b and pattern link data 54b as shown in FIG. 16B. In this case, in the pattern corresponding to the pattern end data 54b, in order to avoid the beam blur at the end part, the beam position on the CP aperture mask is respectively set as a square beam as shown at the right and left sides in FIG. 16A. As for the pattern corresponding to the pattern link data 54a, as shown in the middle of FIG. 16A, the beam position on the CP aperture mask is set. On the basis of the overlap data 52, in order that three beams may be projected in overlap onto the wafer as shown in FIG. 14C, the size of the beam is set in the beam corresponding to the pattern link data shown in the middle of FIG. 14B.

In a shot sorting unit 56, the pattern link data 54a and beam size data are inputted from the pattern link processing unit 55a, and the pattern end data 54b and beam position data are inputted from the pattern end processing unit 55b. The shot sorting unit 56 creates data (shot analysis data) relating to the sequence of shot exposures in a subsidiary deflection region on the basis of this data.

The shot data including these shot sequence data, pattern link data 54a, pattern end data 54b, beam size data and beam position data are inputted into a control circuit 57. The control circuit 57 divides the shot data into main deflection amount, subsidiary deflection amount, stage moving distance, irradiation amount and other individual data, and converts the divided individual data into a proper data format. Besides, a data divider may be installed and the data may be divided.

The divided shot data are transferred to parts of an exposure apparatus 58, and exposure is carried out. The exposure apparatus 58 is, for example, as shown in FIG. 1.

In the above embodiments, the lenses 3 and 5 shown in FIG. 1 are general rotation symmetrical lenses, and the lens 9 is a quadrupole lens, but it may be also applied in a charged beam exposure apparatus in another mode. For example, all lenses may be composed of multiple-pole lenses, such as quadrupole lenses. The same effects are obtained in this case. Electrostatic lenses are used in the embodiment, but magnetic field lenses may similarly be used. As the deflectors 6, 10, magnetic field deflectors may be also used.

Figure 15:
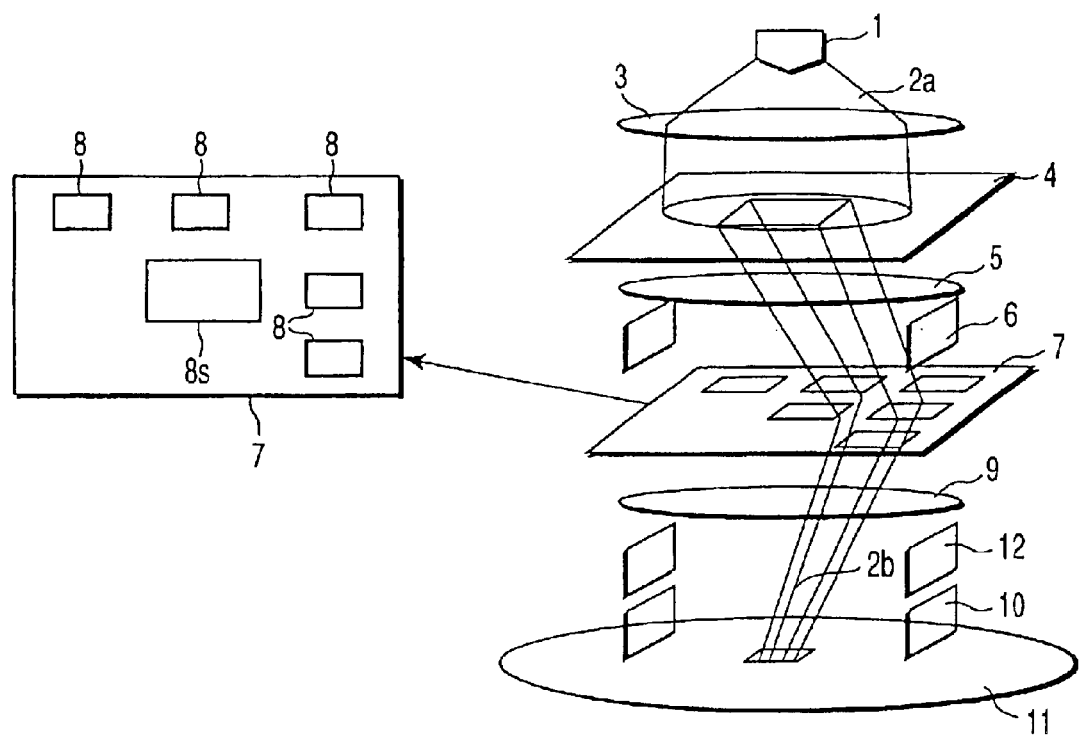
FIG. 15 is plan view and sectional view of a resist pattern formed by using an exposure method according to an eighth embodiment of the present invention.

In the foregoing embodiments, as the method of adjusting the beam blurs in the X- and Y-directions, it is proposed to apply a correction voltage for astigmatism adjustment of the electrostatic lens or electrostatic deflector. However, another method may be employed as a method of adjusting beam blurs in the X- and Y-directions. For example, as shown in FIG. 15, a conventional exposure apparatus may be used, that is, an electrode 12 for astigmatism adjustment that is not used as a deflector or electrostatic lens is disposed at the downstream side of the lens 9 (between the lens 9 and deflector 10).

In the drawing, the electrode 12 for astigmatism adjustment is disposed at the downstream side of the lens 9, but it may be also disposed at the upstream side of the lens 9 (between the lens 9 and the second aperture). Instead of the electrode 12 for astigmatism adjustment, a conventional astigmatism adjustment coil may be disposed at the upstream or downstream side of the lens 9.

(Tenth Embodiment)

A tenth embodiment of the invention will be explained. Herein, the exposure apparatus is an electron beam exposure apparatus, in which the exposure method is a variable shaping and partial batch exposure (CP exposure) method, the stage move is a continuous moving type, and beam deflection is a main and subsidiary two-step deflection method.

Figure 18A:
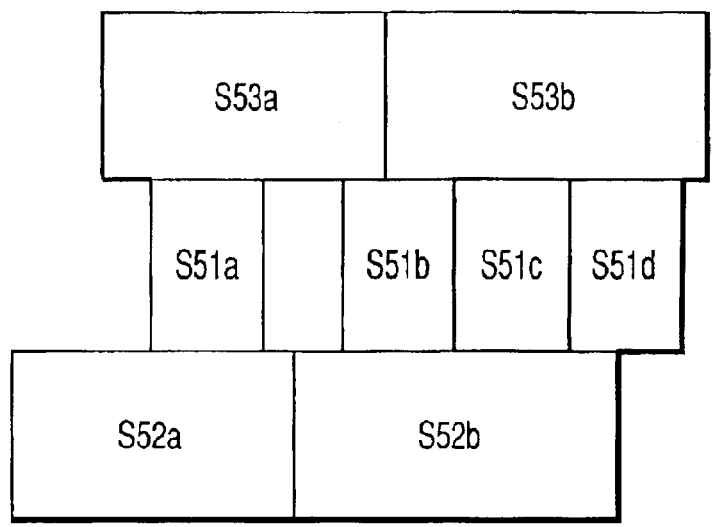
FIG. 18A to FIG. 18C are diagrams explaining a comparative example according to a tenth embodiment of the present invention.
Figure 18B:
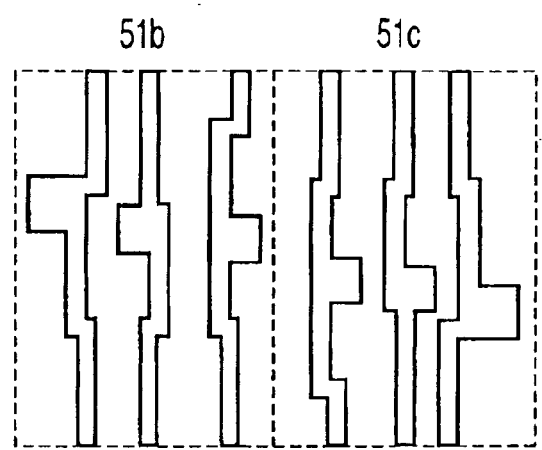
Figure 18C:
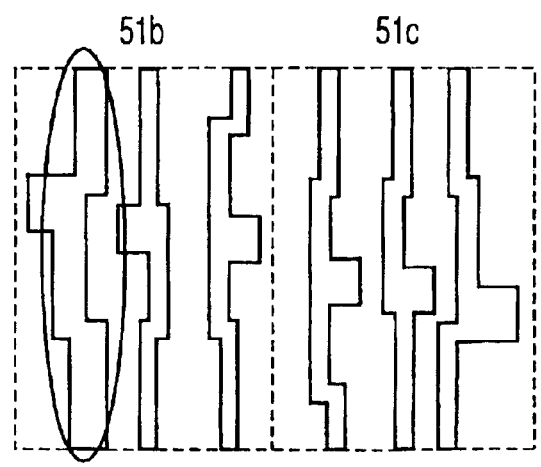

First, as a comparative example, problems occurring in the case of CP exposure by the prior art are explained by referring to FIG. 18A to FIG. 18C.

As shown in FIG. 18A, suppose configuration of CP shots S51a to S51d, CP shots S52a to S52b, and CP shots S53a to 253b. Paying attention to the CP shots S51a to S51c, a wide space is open between the CP shot S51a and the CP shot S52b.

FIG. 18B shows a resist pattern corresponding to the CP shots S51b, S51c. Herein, the dimension of the resist pattern is controlled sufficiently.

FIG. 18C shows an etching pattern in the case of etching by using this resist pattern as the mask. When etched by using this resist pattern as the mask, the left side of the CP shot S51b is open wide. As a result, the dimension of the etching pattern corresponding to the left side pattern in the CP shot S51b is thick, as shown in FIG. 18C.

In the prior art, the CP shots S61a to S61d are exposed by the same exposure amount. Accordingly, for dimensional control, there is no other method than changing of the dimension of the CP pattern.

However, depending on the CP pattern disposed around the CP pattern to be changed in dimension, the dimension change amount of the CP pattern varies. It is hence required to prepare plural CP aperture masks for dimension correction of the same CP pattern. As a result, it takes a longer time in the exposure process.

This is to explain the exposure method of the embodiment capable of making a resist pattern having a desired pattern without changing the dimensions of the CP pattern.

Figure 19:
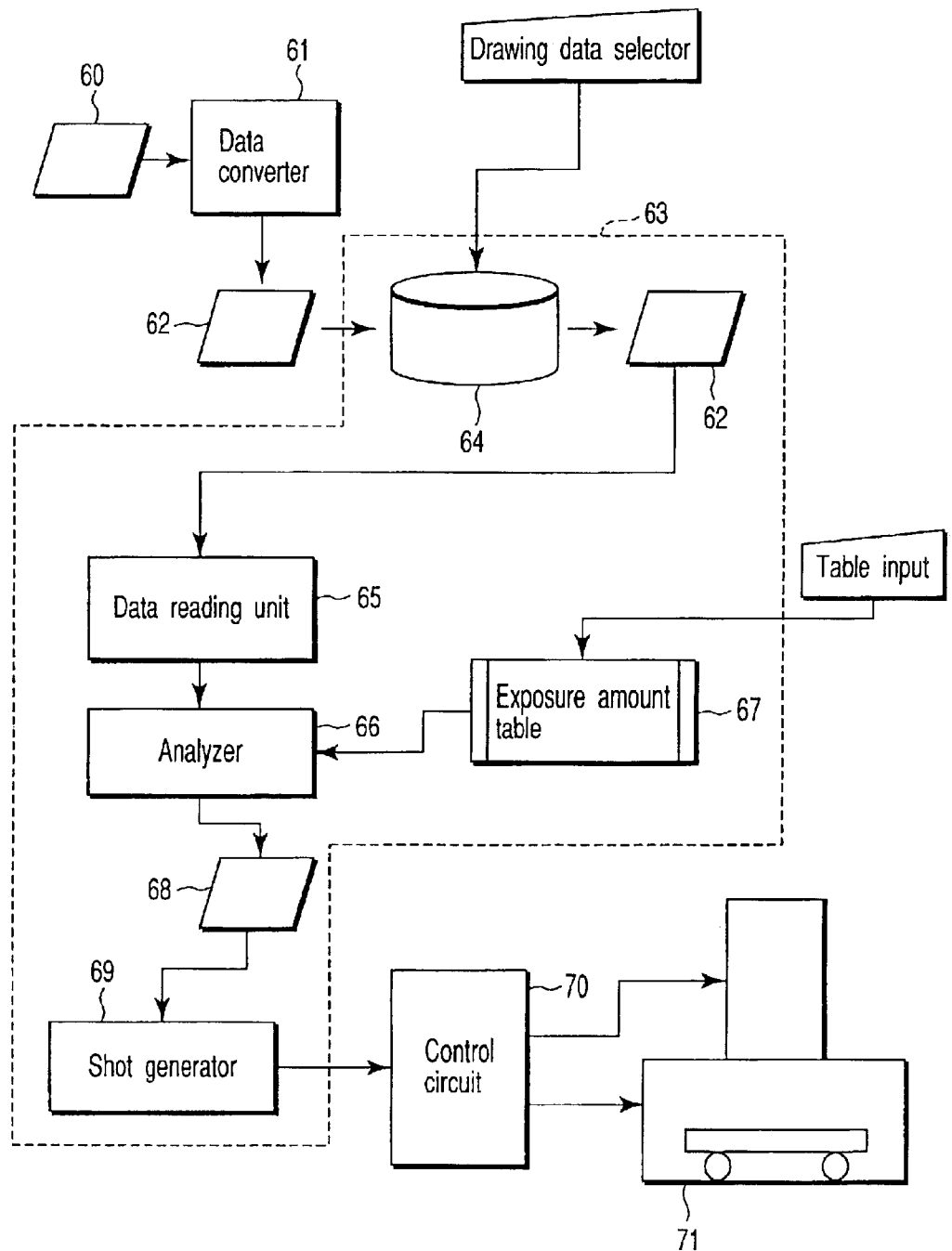
FIG. 19 is a schematic diagram of an exposure apparatus system according to the tenth embodiment of the present invention.

FIG. 19 is a diagram schematically showing an exposure apparatus system of the embodiment. The exposure apparatus system of the embodiment is controlled by an exposure control program (not shown). A data generator 63 is controlled by the exposure control program, and analyzes and generates the shot data as explained below. The data generator 63 may also be realized on a computer, by composing by the software as part of the control program, or may be formed as part of a drawing control circuit 70 by replacing with exclusive hardware.

Design data 60 is inputted into a data converter 61 including a data conversion program. The design data 60 is converted into drawing data 62 by the data converter 61.

Herein, the design data 60 is graphic data of an LSI pattern created by using a CAD tool. Generally, it is made in a data format called GDS2 format. The drawing data 62 is a data format exclusive for electron beam exposure apparatus created by the data conversion program. The drawing data 62 is described in a format conforming to the specification of the electron beam exposure apparatus.

The drawing data 62 is transferred into the data generator 63, and stored in a storage unit 64. The storage unit 63 is, for example, a semiconductor storage device such as DRAM. Of the drawing data stored in the storage unit 64, the drawing data 62 selected by an operator is read into a data reading unit 65.

At this time, the drawing data 62 is read into the data reading unit 65 in the units of frame. In the drawing data 62 in each frame unit, the shot coordinates and shot size are described in the sub-field unit. The data relating to the shot position in the drawing data 62 is converted into a data format of the type relating to the exposure apparatus, and read into the data reading unit 65.

The drawing data 62 read into the data reading unit 65 is inputted into a shot analyzer 66. The shot analyzer 66 also receives data (table data) from an exposure amount table 67. The exposure amount table 67 is preliminarily inputted in the data generator 63. The exposure amount table 67 is described later.

The shot analyzer 66 creates shot data 68 on the basis of the drawing data 62 and table data. The shot data 68 includes data relating to the main deflection amount, subsidiary deflection amount, stage move distance, irradiation amount and other attributes (attribute data). It also includes the data about the attributes (dimension correction) mentioned later (attribute data).

The shot data 68 is sent into a shot generator 69. The shot generator 69 generates correction shots from the attribute data in the shot data 68.

After generating correction shots, the shot data 68 is sent into the control circuit 70, and transferred to parts of the exposure apparatus 71, and thereby exposure is carried out.

The dimension correction of resist patterns of the embodiment is explained. Refer to FIG. 18A to FIG. 18C, and FIG. 20A to FIG. 20D.

The exposure amount table 67 describes reference exposure amount E1 (or exposure amount when correction is not necessary), exposure amount E2 relating to a CP shot requiring dimension correction, and correction exposure amount E3 corresponding to the distance (rank) between the CP shot requiring dimension correction and an adjacent CP shot.

The CP shot requiring dimension correction is, herein, one of which distance to an adjacent CP shot is longer than predetermined. For example, in FIG. 18A, the CP shot S51b is widely distant from the adjacent CP shot S51a, and it is a CP shot requiring dimension correction.

(1) When reading the drawing data 62 into the data reading unit 65, by a calculating and deciding unit (not shown), a distance from an adjacent CP shot (adjacent CP shot spacing) within a preset research range (distance) is calculated, and it is decided whether or not the distance between the adjacent CP shots is within a predetermined value. For calculation of the distance between adjacent CP shots, other drawing data other than the drawing data 62 may also be used.

For example, in the case of the CP shot S51b in FIG. 18A, the distance between the CP shot S51a and the CP shot S51b is calculated. Suppose the distance is longer than predetermined.

(2) When the distance between adjacent CP shots is decided to be more than the predetermined value, the data relating to the attributes (attribute data) depending on the direction of adjacent CP shot and the distance between adjacent CP shots are given to the shot data 68 generated in the shot analyzer 66. That is, aside from the main deflection data, subsidiary deflection data, stage and reference exposure amount E1, the exposure amount E3 and correction exposure amount E3 are given as attribute data. On the other hand, when the distance between adjacent CP shots is decided to be less than predetermined, attribute data of no need of dimension correction is given.

In the example of the CP shot S51b in FIG. 18A, since the distance to the left side CP shot S51a of the CP shot 51b is more than predetermined, the CP shot S51b is decided to be a shot to be corrected. The exposure amount E2 and correction exposure amount E3 are further added as attribute data.

(3) In each shot data 68, correction shot data is created for the CP shot requiring correction on the basis of the given attribute data.

(4) After the process of (1) to (3), the shot data and correction shot data are transferred to the amplifier of the deflector of the electron beam exposure apparatus 71 by way of the control circuit 70 of the electron beam exposure apparatus. Generally, the exposure amount data (irradiation time data) depending on the attribute whether the ordinary shot or the shot to be corrected is sent to the blanking amplifier.

(5) At the time of exposure (drawing), the CP shot not requiring dimension correction with respect to the CP pattern is exposed by the reference exposure amount E1. The CP shot requiring dimension correction with respect to the CP pattern is exposed by the exposure amount E2 on the whole CP pattern, and the CP pattern requiring dimension correction in the CP pattern is exposed selectively by the correction exposure amount E3 as correction. This operation is explained specifically by referring to FIG. 18A to FIG. 18C, and FIG. 20A to FIG. 20D. The CP shot requiring dimension correction is CP shot S51b, and the CP shot not requiring dimension correction is CP shot S51c.

Figure 20A:
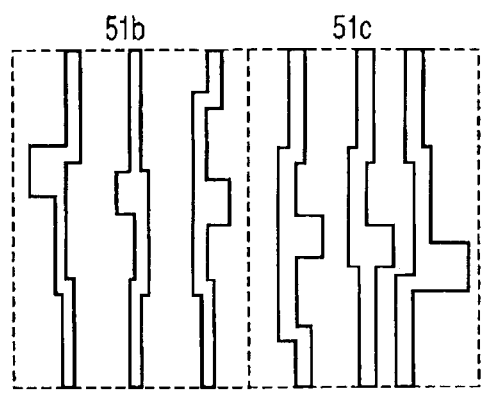
FIG. 20A to FIG. 20D are explanatory diagrams of dimension correction of a resist pattern according to the tenth embodiment.

FIG. 20A shows a short pattern (exposure pattern) on the resist in the case of the CP shot S51b by the exposure amount E2, and a shot pattern on the resist in the case of the CP shot S51c by the reference exposure amount E1.

Herein, the exposure amount E2 is 5% smaller than the reference exposure amount E1. In this case, the dimension of the CP shot S51b is about 10% smaller than in the case of exposed by the reference exposure amount E1. As shown in FIG. 20A, the width of the shot pattern in the case of the CP shot S51b by the exposure amount E2 is smaller than the width of the shot pattern in the case of the CP shot S51c by the reference exposure amount E1.

Figure 20B:
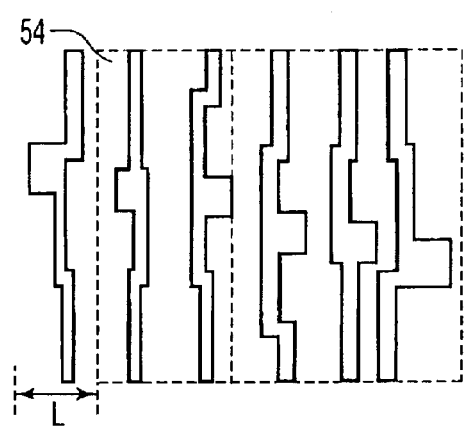

FIG. 20B shows a region 54 of correction exposure to be done on the CP pattern requiring dimension correction in the CP shot S51b. The region 54 shows a pattern to be exposed by the correction exposure amount E3. The pattern to be exposed-by the correction exposure amount E3 is a pattern formed in a smaller size than the intended size as a result of exposure by the exposure amount E2. The region 54 is corrected and exposure by the correction exposure amount E3. The beam used in correction exposure is created on the basis of the correction shot data.

At this time, the size of the region 54 of correction shot is such that is obtained by subtracting a size of region including a pattern in the CP pattern (left side pattern in FIG. 20B) whose pattern dimension is influenced by a CP shot pattern existing around the CP pattern 51b (CP pattern 51a in FIG. 18A to FIG. 18C) from a size of the CP pattern 51b.

In FIG. 20B, the size of the region is the result of subtracting the region of dimension L in the lateral direction (X-direction) including only the left side pattern having effects of pattern dimensions, from the square region including three patterns in the CP pattern 51b. Depending on the peripheral CP shot pattern, the size of the region having effects of pattern dimension is determined by this process, and it is preliminarily stored in the exposure amount table as the exposure parameter (dimension L in this case).

Figure 20C:
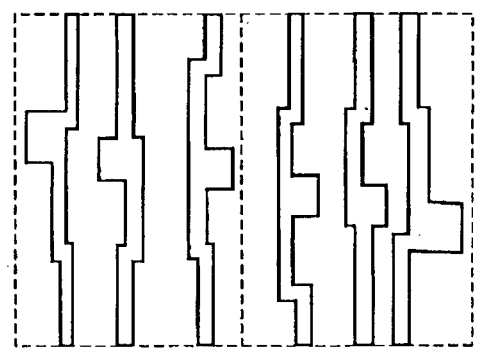

FIG. 20C shows the resist patterns obtained by developing the resist exposed by the reference exposure amount E1, exposure amount E2, and correction exposure amount E3. Herein, of the three CP patterns in the CP shot S51b, only the resist pattern corresponding to the left side CP pattern is finished in a smaller thickness than the other resist patterns corresponding to the CP patterns in the middle and at the right side.

Figure 20D:
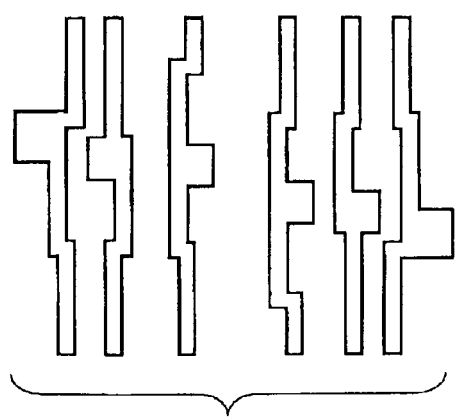

FIG. 20D shows etching patterns in the case of etching by using the resist pattern as the mask. Increase of thickness is not observed in the resist pattern corresponding to the edge portion of the CP pattern at the left side of the CP shot S51b.

Effects of the embodiment are described below.

Firstly, in the stage of the exposure process, information necessary for a correction process is directly created from the drawing data. That is, the CP shot requiring dimension correction is searched in the usual process of reading the drawing data in the data generator 63, and information necessary for correction process is created.

Giving the attribute relating to the dimension correction of the data shot 68, the exposure amount of the CP shot to be corrected, presence or absence (position) of correction shot, and exposure amount of correction shot are determined according to the attributes. Accordingly, in the case of dimension change due to change of etching conditions, it is not necessary to remake the design data or drawing data, and flexible processing can be done.

Further, by processing to correct the dimension simultaneously with the conventional process of reading of drawing data by the data generator 63, increase of processing time due to a dimension correction process can be suppressed.

Secondly, the exposure amount table 67 is prepared, which describes the reference exposure amount E1, exposure amount E2 for the CP shot requiring dimension correction, and correction exposure amount E3 corresponding to the distance (rank) to the adjacent pattern. As a result, the dimensional variation depending on the distance to the adjacent pattern can be corrected with high precision. If the etching condition is changed, the dimensional fluctuation can be flexible processed without remaking the design data or drawing data.

Thirdly, the exposure amount E2 of the CP shot to be corrected is adjusted somewhat slightly, and the CP shot to be corrected is exposed by overlapping the correction shot by the correction exposure amount E3. As a result, without changing the size of the CP pattern (aperture), dimensional increase can be prevented, while dimensional reduction is prevented in the CP pattern not requiring dimension correction. Further, by correcting the exposure amount E2 and correction exposure amount E3, the dimension can be corrected, and it is not necessary to prepare or make plural CP aperture masks including plural CP patterns corrected in dimension corresponding to plural etching conditions in the same pattern, and a resist pattern having a desired pattern can be formed. That is, when forming the same patterns, if the process conditions are changed, an exposure method capable of preventing increase of required time in the exposure process is realized.

In the embodiment, by adjusting the exposure amount E2 of the CP shot to be corrected in dimension and overlapping and exposing the correction shot by the correction exposure amount E3, dimensional fluctuations are decreased, but the correction shot may be done by the CP exposure by the exposure using VSB (VSB exposure).

In this embodiment, the exposure corresponding to the exposure amount E2 is done by CP exposure, but it may be also done by VSB exposure. In this case, the same method and apparatus as in the case of CP exposure can be used. That is, it is basically the same as in the case of CP exposure in the point that an exposure amount table describing the reference exposure amount E1, exposure amount E2 for the VSB shot requiring dimension correction, and correction exposure amount E3 corresponding to the distance (rank) between the VSB shot requiring dimension correction and its adjacent VSB shot is used instead of the exposure amount table 67. The correction shot can be also done by the CP exposure and VSB exposure.

(Eleventh Embodiment)

An eleventh embodiment of the invention is explained. Herein, the exposure apparatus is an electron beam exposure apparatus, in which the exposure method is a variable shaping and partial batch exposure (CP exposure) method.

Figure 21:
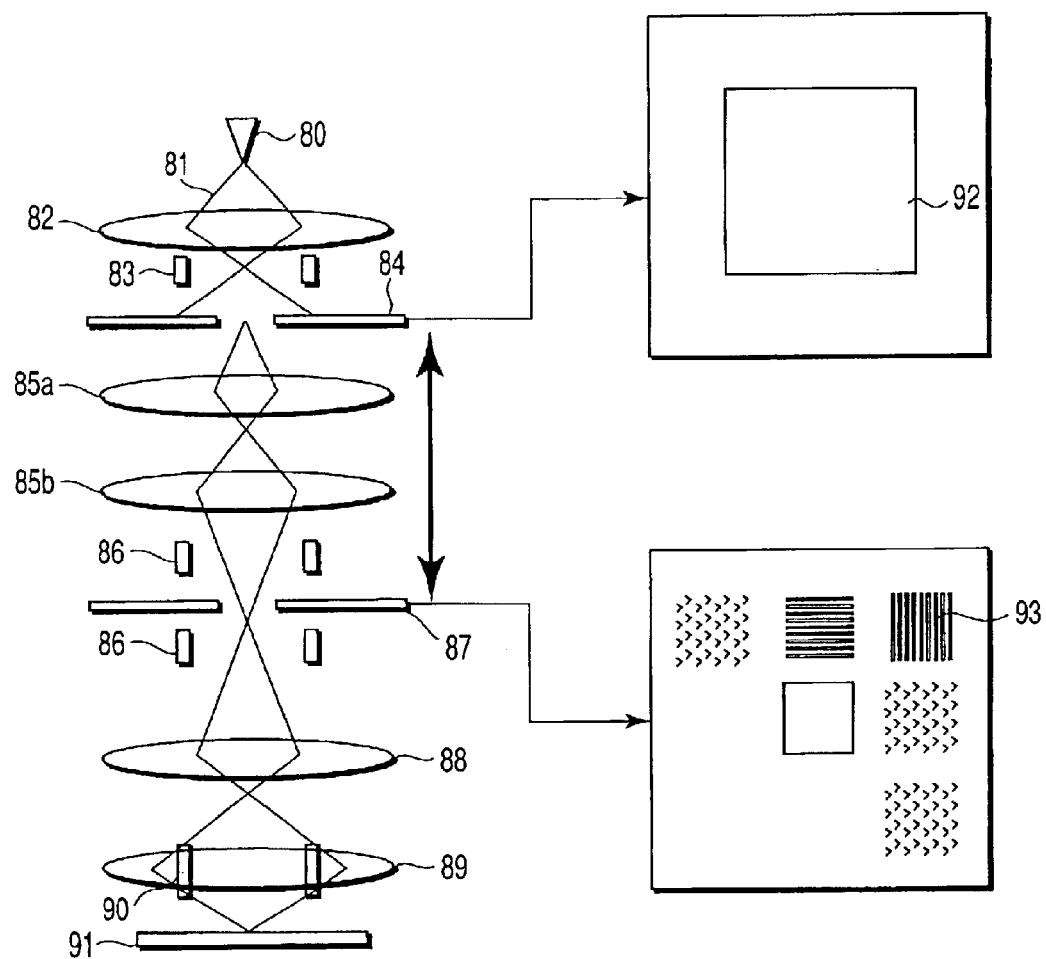
FIG. 21 is a diagram explaining a comparative example according to an eleventh embodiment of the present invention.

First, as a comparative example, a schematic configuration of a conventional electron beam exposure apparatus is explained by referring to FIG. 21.

An electron beam 81 generated from an electron gun 80 passes through a CL lens 82, and is emitted onto a square opening 92 of a first aperture mask 84 by means of a blanking deflector 83. The electron beam 81 having passed through the square opening 82 is emitted to a desired position on a second aperture mask (CP aperture mask) 87 by means of a CP deflector 86.

Herein, the opening density of the square opening 92 of the first aperture mask 84 is 100%. On the second aperture mask 87, an opening of L/S pattern shape (L/S pattern opening portion) 93 is provided as one CP pattern. The electron beam 81 passing through the second aperture mask 87 is reducibly projected onto a wafer (sample) 91 by a lens system (reducing lens 88, objective lens 89).

The reducing scale of this apparatus is 1/10, and the maximum beam size is 10 $\mu$m. As a result, the size of the aperture opening (square opening 92) is 100 $\mu$m square. Reference numerals 85$a$, 85$b$ are first and second PL lenses and 90 is an objective deflector.

FIG. 22 shows a schematic structural diagram of an exposure apparatus of the embodiment. This apparatus is an electron beam exposure apparatus of CP & variable shaping type with acceleration voltage of 5 keV. The state motion is of continuous transfer type, and beam deflection is main and subsidiary two-step deflection system.

An electron beam 81 generated from an electron gun 80 passes through a CL lens 82, and is emitted onto an opening of L/S pattern shape (L/S pattern opening portion) 94 on a first aperture mask 84 by means of a blanking deflector 83'.

This blanking deflector 83' is a blanking deflector for turning on and off the beam, further having a beam deflecting function for selecting the opening on the first aperture mask 84. It may be realized by adding a beam deflecting function for selecting the opening on the first aperture mask 84 to a conventional blanking deflector 83, or the beam deflecting function for selecting the opening on the first aperture mask 84 may be realized by installing an extra deflector.

In the conventional apparatus, the electron beam 81 passing through the L/S pattern aperture 94 emitted onto the square opening 92 has an L/S pattern shape as mentioned above. This electron beam 81 in L/S pattern shape is emitted to a desired position on the second aperture mask (CP aperture mask) 87 by means of the CP deflector 86.

The opening density of the L/S pattern opening portion 94 of the first aperture mask 84 of the embodiment is 50% of the opening density of the square opening 92 of the first aperture mask 84 of the conventional apparatus. Hence, the beam current between the first aperture mask 84 and the second aperture mask 87 can be controlled below 50% that of the conventional apparatus.

The second aperture mask 87 has an L/S pattern opening portion 93. The line direction of the L/S pattern opening portion 94 of the first aperture mask 84 and the line direction of the L/S pattern opening portion 93 of the second aperture mask 87 are identical.

The electron beam 81 passing through the second aperture mask 87 is reducibly projected onto the wafer 91 by means of a lens system (reducing lens 88, objective lens 89).

The reducing scale of this apparatus is 1/10, and the maximum beam size is 10 $\mu$m. Hence, the size of the aperture opening (L/S pattern opening portion 94) is 100 $\mu$m square.

Figure 23A:
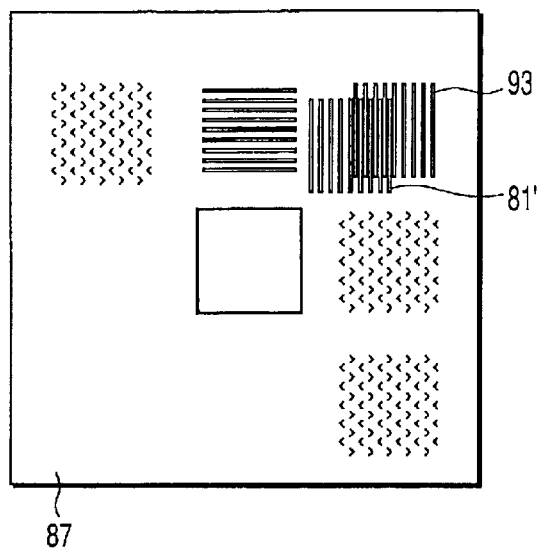
FIG. 23A to FIG. 23C are explanatory diagrams of an exposure method according to the eleventh embodiment.
Figure 23B:
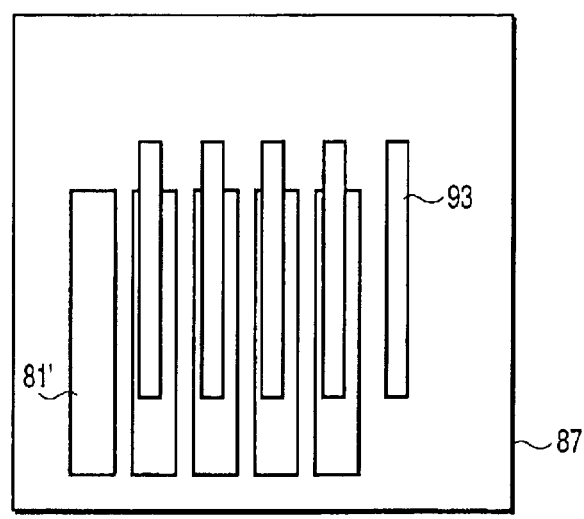
Figure 23C:
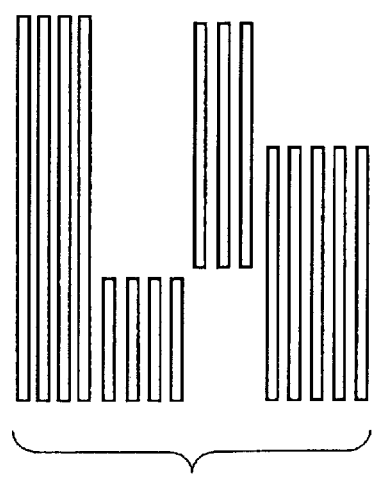

FIG. 23A to FIG. 23C are diagrams explaining the exposure method using the electron beam exposure apparatus of the embodiment.

In FIG. 23A, an electron beam (first aperture transmission beam) 81' passing through the L/S pattern opening portion 94 of the first aperture mask 84 is emitted to the L/S pattern opening portion 93 of the second aperture mask 87. The shape of the first aperture transmission beam 81' is an L/S pattern shape, and its line direction is same as the line direction of the L/S pattern opening portion 93 of the second aperture mask 87.

At this time, as shown in FIG. 23B, by varying the degree of overlap of the first aperture passing beam 81' and L/S pattern opening portion 93 of the second aperture mask 87, various L/S patterns of different shapes can be obtained.

It is important herein that the first aperture transmission beam 81' can uniformly illuminate the L/S pattern opening portion 93 of the second aperture mask 87. For this purpose, the line width of the first aperture transmission beam 81' is preferred to be larger than the line width of the L/S pattern 93 of the second aperture mask 87 as shown in FIG. 23B.

The pattern of the first aperture transmission beam 81' passing through the L/S pattern opening portion 93 of the second aperture mask 87 is reducibly projected onto the wafer 91. Such exposure is repeated as many times as required. Consequently, by the known pattern process such as development, a wiring pattern can be formed on the wafer 91. For example, by performing such exposure four times, a wiring pattern shown in FIG. 23C can be formed.

Effects of the embodiment are explained.

Using the electron beam exposure apparatus of the embodiment, as compared with the case of using the conventional electron beam exposure apparatus, the beam current between the first aperture mask 84 and the second aperture mask 87 can be decreased to 50% or less.

As a result, the value of I can be decreased in formula (1), that is, Blur=(I·L)/($\Box$·V$^{1.5}$), and the beam blur can be decreased. In this embodiment, in particular, the beam blur is decreased because the beam blur due to coulomb effect occurring between the first aperture mask 84 and the second aperture mask 87 can be decreased to half or less.

Therefore, the embodiment can decrease the beam blur of the L/S pattern large in the total beam current, and enhance the beam resolution. Accordingly, by emitting and exposing by matching the line direction of the first aperture transmission beam 81' with the line direction of the L/S pattern opening portion 93 of the second aperture mask 87, the wiring pattern can be formed at higher precision than in the art.

FIG. 24A to FIG. 24D show a modified example of the embodiment.

Figure 24A:
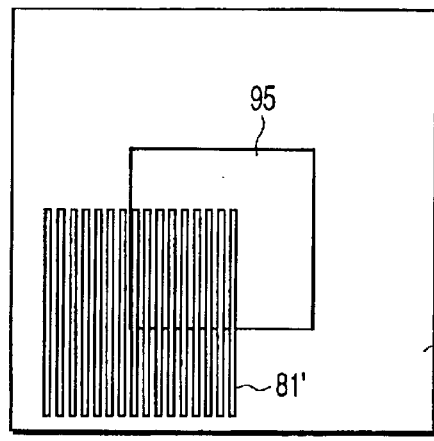
FIG. 24A to FIG. 24D are explanatory diagrams of a modified example according to the eleventh embodiment.
Figure 24B:
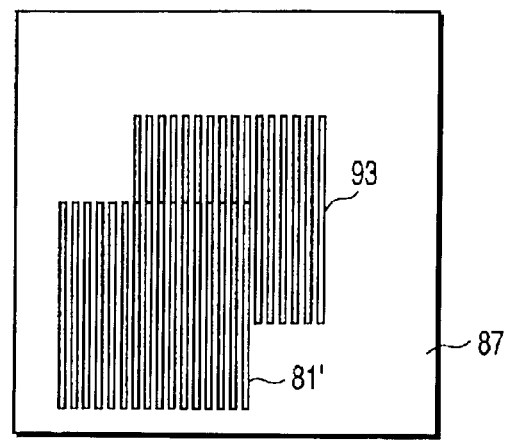

FIG. 24A shows a method of forming the wiring pattern with a higher precision than in the prior art by emitting the first aperture transmission beam 81' onto the square opening 95 of the second aperture mask 87. FIG. 24B shows a method of forming the wiring pattern with higher precision than in the prior art by setting the line width of the first aperture transmission beam 81' nearly same as the line width of the L/S pattern opening portion 93 of the second aperture mask 87.

Figure 24C:
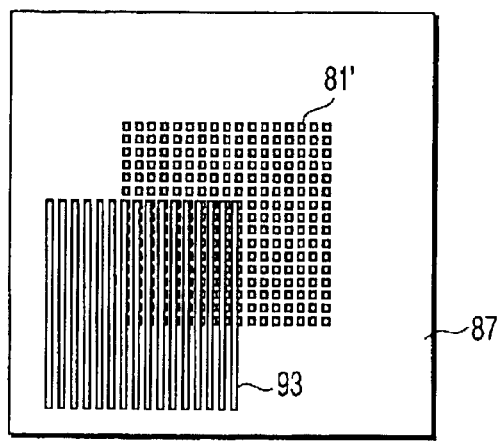
Figure 24D:
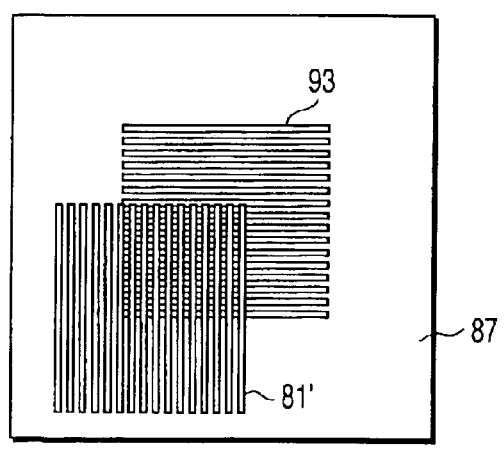

FIG. 24C and FIG. 24D show a method of forming a contact hole pattern. FIG. 24C shows a method of forming an arrayed contact hole pattern with higher precision than in the prior art by emitting the first aperture transmission beam 81' having an arrayed contact hole pattern onto the L/S pattern opening portion 93 of the second aperture mask 87.

The first aperture transmission beam 81' having an arrayed contact hole pattern can be formed by using the first aperture mask 84 having an arrayed contact hole pattern.

In this case, the opening density of the arrayed contact hole pattern can be reduced to half of the opening density of the L/S pattern opening portion 94. As a result, the beam current between the first aperture mask 84 and the second aperture mask 87 can be decreased to 25% or less of the conventional apparatus. Therefore, the beam blur can be further decreased.

If the first aperture transmission beam 81' of L/S pattern shape is emitted to the arrayed contact hole pattern opening portion of the second aperture mask 87, the arrayed contact hole pattern can be formed with high precision than in the prior art.

FIG. 24D shows a method of forming an arrayed contact hole pattern at higher precision than in the prior art by emitting and exposing by matching the line direction of the first aperture transmission beam 81' with the direction vertical to the line direction of the L/S pattern opening portion 93 of the second aperture mask 87.

In another method of forming an arrayed contact hole pattern, for example, the first aperture transmission beam 81' having an arrayed contact hole pattern is emitted on the square opening 95 of the second aperture mask 87.

Figure 25:
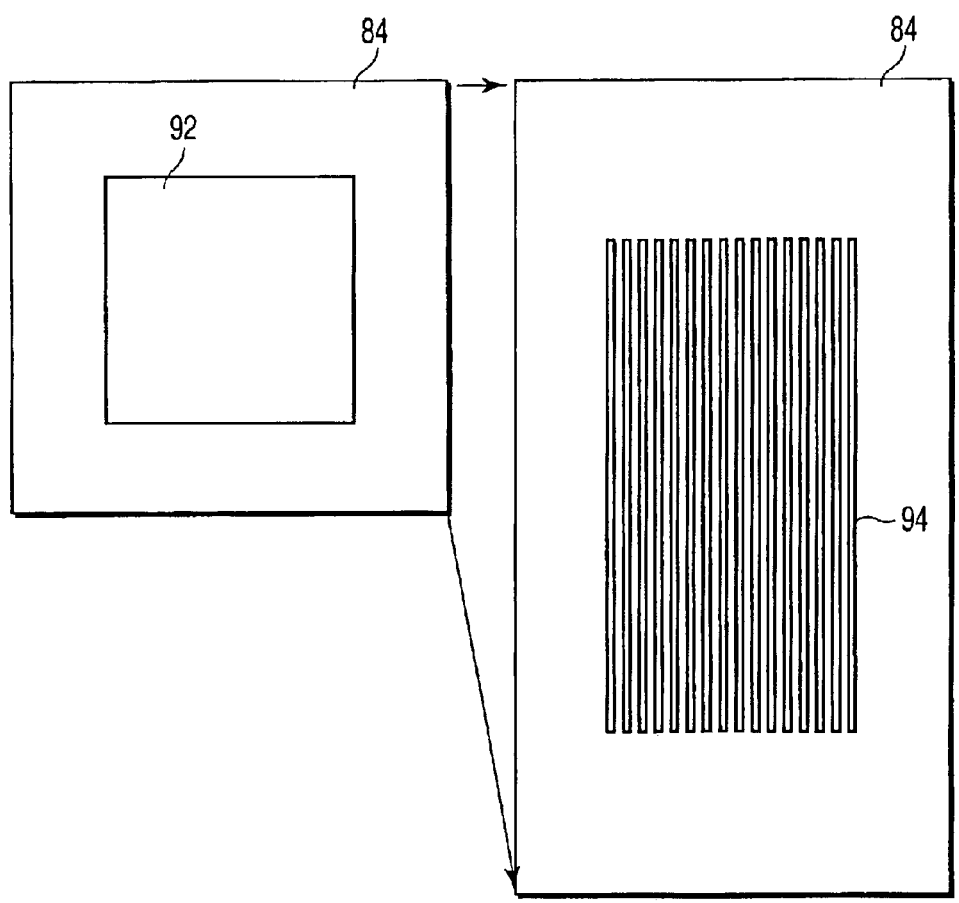
FIG. 25 is an explanatory diagram of another modified example of the eleventh embodiment.

FIG. 25 shows a modified example of the embodiment. As shown in FIG. 25, in this embodiment, the dimension is set longer in the line longitudinal direction (wiring longitudinal direction) of the L/S pattern opening portion 94' on the first aperture mask 84, and the beam surface area is set larger than the square opening 92. However, the opening density of the L/S pattern opening portion 94' is set below the opening degree of the square opening 92.

By using the aperture mask 84 having such L/S pattern opening portion 94', the wiring pattern of the same length can be formed by a smaller number of shots without increasing the beam blur, and in other words, by decreasing the number of beam link positions, it is possible to form at higher precision.

Figure 26A:
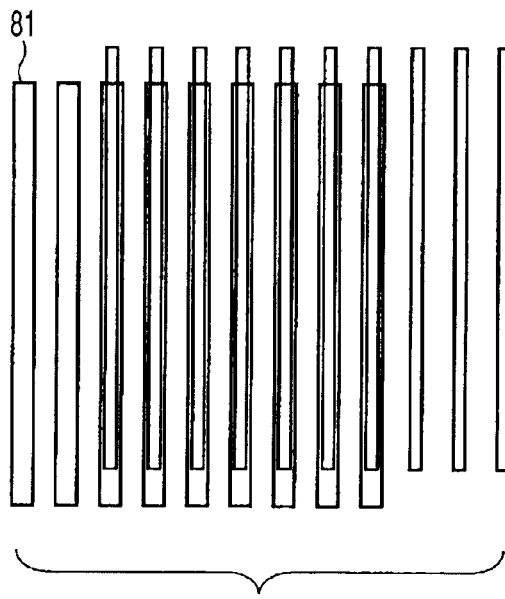
FIG. 26A to FIG. 26D are explanatory diagrams of a further different modified example of the eleventh embodiment.

FIG. 26A to FIG. 26D show a further different modified example of the embodiment. FIG. 26A shows a mode of emitting a first aperture transmission beam 81' of L/S pattern shape on an L/S pattern opening portion 93' on the second aperture mask. The width of the L/S pattern opening portion 93' in this modified example is narrower than the width of the L/S pattern opening portion 93.

Figure 26C:
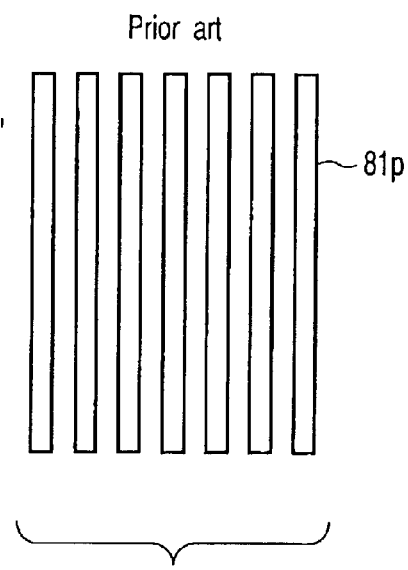
Figure 26B:
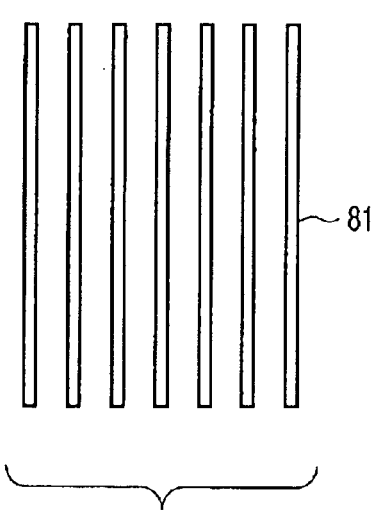

Accordingly, as shown in FIG. 26B and FIG. 26C, the width of a shot pattern 81p' formed on the wafer when emitting the first aperture transmission beam 81' onto the L/S pattern opening portion 93' is narrower than the width of the shot pattern 81p (prior art) formed on the wafer when the aperture transmission beam 81' is emitted onto the L/S pattern opening portion 93. That is, according to this modified example, the beam blur formed on the wafer can be decreased.

Figure 26D:
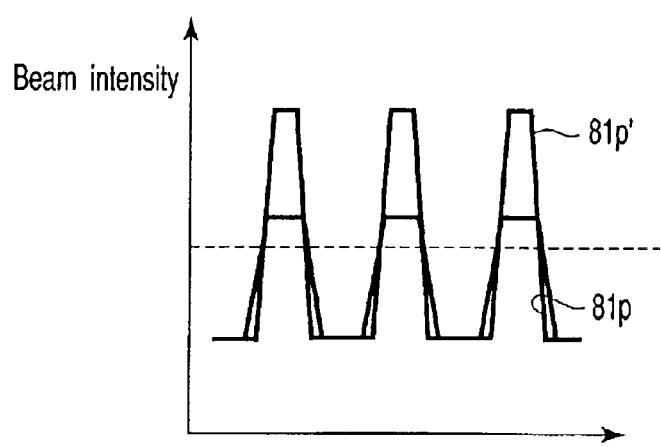
Figure 27:
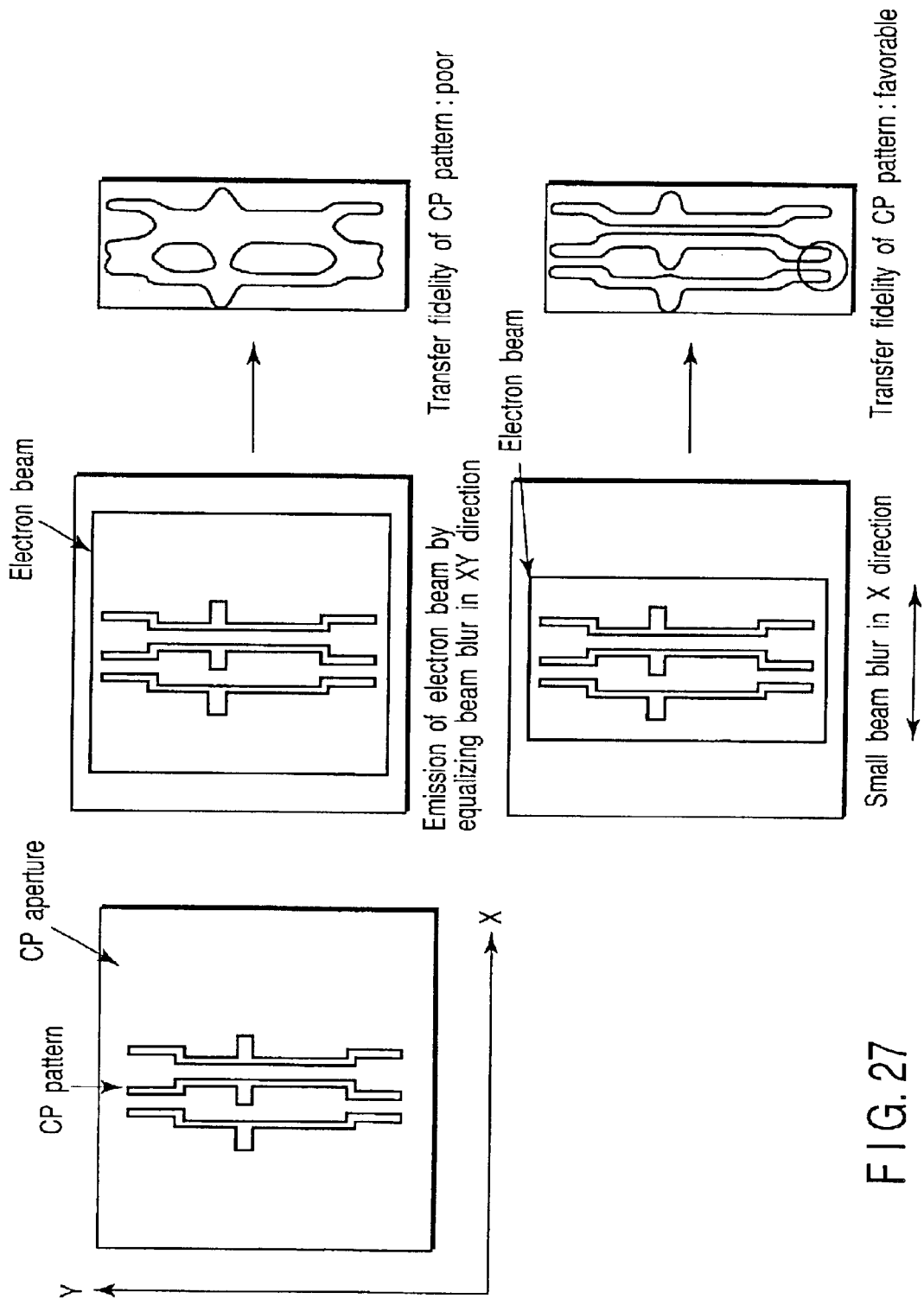
FIG. 27 is a diagram explaining problems of a conventional exposure method.
Figure 28A:
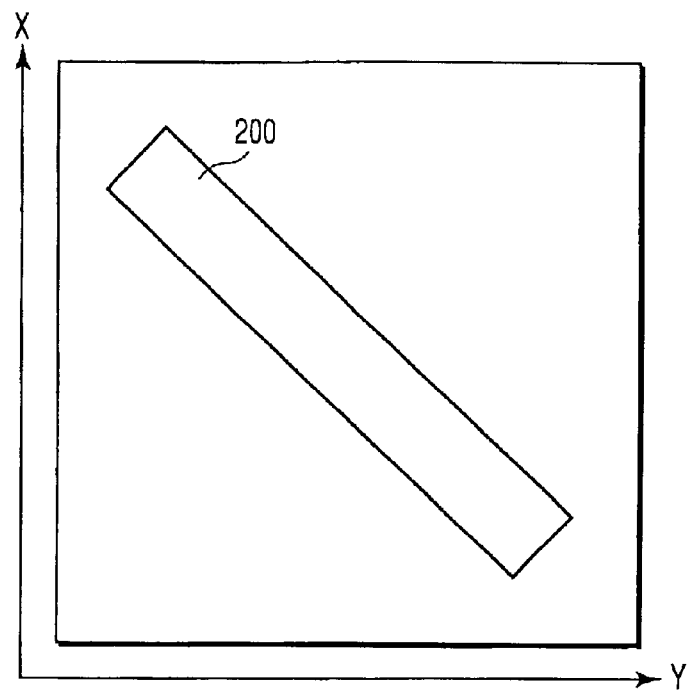
FIG. 28A and FIG. 28B are diagrams showing an aperture mask for forming oblique wiring in a prior art.
Figure 28B:
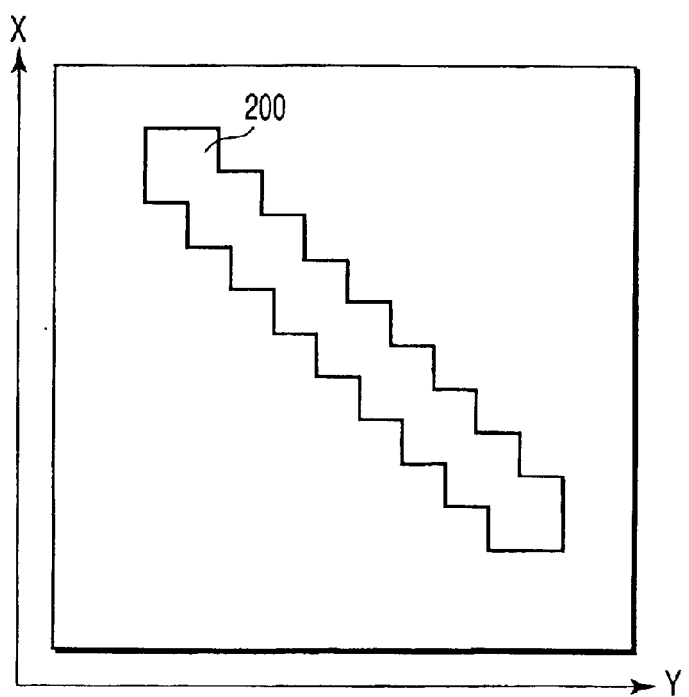
Figure 29A:
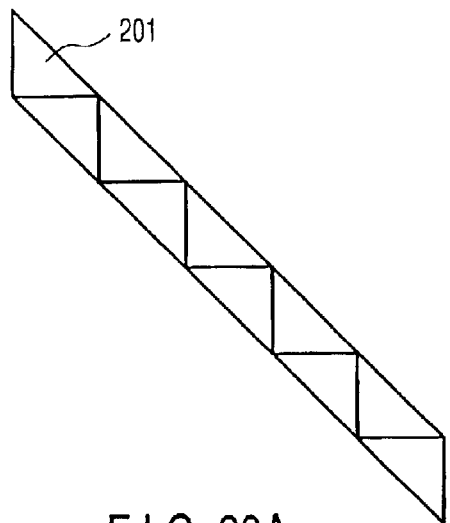
FIG. 29A and FIG. 29B are diagrams showing a beam shot for forming oblique wiring in the prior art.
Figure 29B:
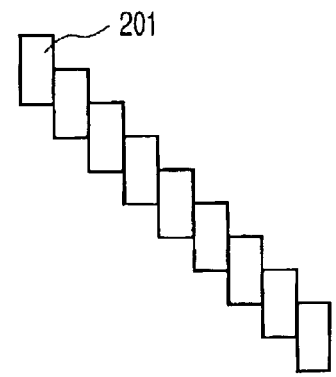
Figure 30A:
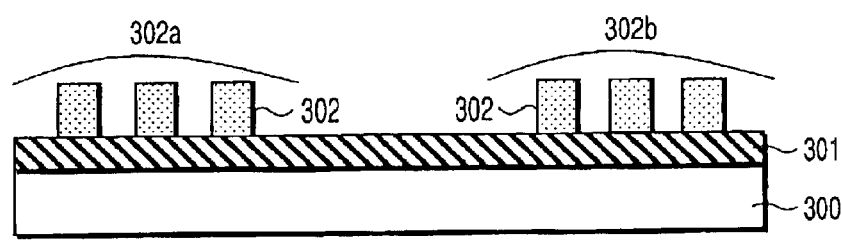
FIG. 30A and FIG. 30B are diagrams explaining local dimensional variation of a pattern occurring in conventional etching.
Figure 30B:
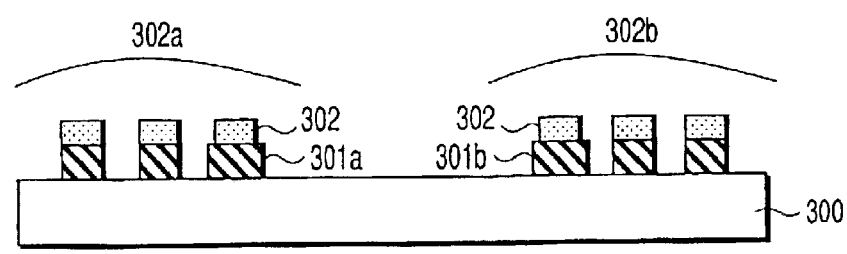

However, in order to finish the width of the wiring pattern to the design dimension, as shown in FIG. 26D, the exposure amount must be increased. In this case, as a result of increase of exposure amount, the beam intensity of the shot pattern 81p' is sufficiently higher than the threshold indicated by dotted line (the minimum beam intensity necessary for sensitizing the resist) as shown in FIG. 26D. Hence, a larger process margin for exposure is needed as compared with the prior art.

In the foregoing embodiments, the electron beam exposure apparatus is explained, but the invention can be applied to other exposure apparatuses using a charged beam. For example, it can be applied to an ion beam exposure apparatus. Aside from a charged beam, it can also be applied to an exposure apparatus using an energy beam, such as laser beam.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An energy beam exposure method using an energy beam exposure apparatus capable of controlling magnitude relation between a blur of an energy beam in a first direction and a blur of the energy beam in a second direction different from the first direction for exposing a pattern on a sample in the energy beam exposure apparatus, comprising:

adjusting the magnitude relation of the blurs of the energy beam in the first and second directions so that the blur of the energy beam in one of the first and second directions is set smaller than the blur of the energy beam in the other of the first and second directions;

adjusting the direction of the sample in the energy beam exposure apparatus on the basis of the pattern to be projected onto the sample and the magnitude relation of the blurs of the energy beam in the first and second directions; and projecting the pattern onto the sample by exposing the sample to the energy beam and using shape correction of the pattern, the shape correction being needed to compensate differences in the blurs of the energy beam in the first and second directions.

2. The energy beam exposure method according to claim 1, wherein the pattern to be projected onto the sample includes a line pattern, the method further comprising adjusting the direction of the sample in the energy beam exposure apparatus such that the line width direction of the line pattern coincides with the direction of the smaller blur of energy beam out of the first and second directions.

3. The energy beam exposure method according to claim 1, wherein the energy beam exposure apparatus is an energy beam exposure apparatus using an aperture mask including a character projection pattern corresponding to the pattern, and the correcting the shape of the pattern includes correcting a shape of the character projection pattern.

4. The energy beam exposure method according to claim 3, wherein correcting a shape of the character projection pattern is executed on the basis of data including design data of a drawing pattern corresponding to the pattern, and shape correction data created on the basis of the blurs of energy beam in the first and second directions.

5. The energy beam exposure method according to claim 1, further comprising adjusting the direction of the sample in the energy beam exposure apparatus outside of the energy beam exposure apparatus, and conveying the direction adjusted sample into the energy beam exposure apparatus.

6. An energy beam exposure method using an energy beam exposure apparatus capable of controlling the magnitude relation between a blur of an energy beam in a first direction and a blur of the energy beam in a second direction different from the first direction, for exposing a pattern comprising a plurality of shot patterns on a sample in the energy beam exposure apparatus comprising:

adjusting the magnitude relation of the blurs of the energy beam in the first and second directions so that the blur of the energy beam in one of the first and second directions is set smaller than the blur of the energy beam in the other of the first and second directions;

determining an overlap quantity of the adjacent two shot patterns depending on the blur of energy beam in a direction of linking the plurality of shot patterns; and projecting the pattern onto the sample by exposing the sample to the energy beam according to the overlap quantity.

7. The energy beam exposure method according to claim 6, wherein the pattern comprising the plurality of shot patterns includes a line pattern, the method further comprising adjusting the direction of the sample in the energy beam exposure apparatus such that the line width direction of the line pattern coincides with the direction of the smaller blur of energy beam of the first and second directions, and conveying the sample into the energy beam exposure apparatus.

8. The energy beam exposure method according to claim 6, wherein the projecting the pattern onto the sample on the basis of the overlap quantity includes matching of the direction of linking the plurality of shot patterns with the direction of the greater blur of energy beam out of the first and second directions.

9. The energy beam exposure method according to claim 6, wherein the energy beam exposure apparatus is an energy beam exposure apparatus comprising a first aperture mask including an opening and a second aperture mask including a character projection pattern corresponding to the plurality of shot patterns, the method further comprising changing a position of the electron beam which is passed through the opening of the first aperture mask and emitted onto the character projection pattern of the second aperture mask by the linking portion of the plurality of shot patterns and the shot patterns corresponding to both ends of the pattern.

10. An energy beam exposure method for exposing a plurality of patterns, each of which comprises a plurality of sub-patterns, on a sample, comprising:

deciding presence or absence of a pattern corresponding to a shot pattern which is not formed in a predetermined dimension, when forming the plurality of shot patterns corresponding to the plurality of patterns on the sample in a predetermined dimension, by projecting the plurality of patterns onto the sample by exposing the sample to the beam with a predetermined exposure amount;

detecting a sub-pattern which is not formed in a predetermined dimension on the sample, out of the plurality of sub-patterns configuring the pattern, when there is a pattern corresponding to the shot pattern which is not formed in a predetermined dimension; and exposing those capable of forming the shot pattern in the predetermined dimension out of the plurality of patterns by the predetermined exposure amount, exposing others not capable of forming the shot pattern in the predetermined dimension by an exposure amount smaller than the predetermined exposure amount, and exposing the sub-pattern detected as not being formed in a predetermined dimension selectively by a correction exposure amount.

11. An energy beam exposure method using an aperture mask including a plurality of character projection patterns, each of which comprises a plurality of patterns comprising:

deciding presence or absence of a character projection pattern corresponding to a shot pattern which is not formed in a predetermined dimension, when forming the plurality of shot patterns corresponding to the plurality of character projection patterns on the sample in a predetermined dimension, by exposing the plurality of character projection patterns by a predetermined exposure amount;

detecting a pattern which is not formed in the predetermined dimension on the sample, out of the plurality of character projection patterns, when there is a character generation pattern corresponding to the shot pattern which is not formed in a predetermined dimension; and exposing those capable of forming the shot pattern in the predetermined dimension out of the plurality of patterns by the predetermined exposure amount, exposing others not capable of forming the shot pattern in the predetermined dimension by an exposure amount smaller than the predetermined exposure amount, and exposing the pattern detected as not being formed in a predetermined dimension selectively by a correction exposure amount.

12. The energy beam exposure method according to claim 10, wherein the correction exposure amount is selected from a correction exposure amount table prepared in advance depending on the distance between adjacent patterns of the plurality of patterns to be formed on the sample.

13. An energy beam exposure method using an aperture mask including character projection patterns comprising:

configuring a character projection pattern corresponding to a desired graphic pattern with opening including linear opening, the liner opening having a width smaller than that of the smallest part of the character projection pattern when a shot pattern of a predetermined dimension can be formed on the sample by exposing the character projection pattern corresponding to the desired graphic pattern by a predetermined exposure amount; and forming the shot pattern of the predetermined dimension on the sample by exposing a character projection pattern with the opening including the linear opening by an exposure amount larger than the predetermined exposure amount.

14. The energy beam exposure method according to claim 13, wherein the width of the linear opening is the minimum width that can be realized on the aperture mask.

15. An energy beam exposure apparatus comprising:

a first aperture mask comprising a first pattern opening portion, the first pattern opening portion including a plurality of openings, the plurality of openings being disposed periodically;

a second aperture mask including a plurality of pattern opening portions;

an irradiation unit including a blanking deflector for selectively irradiating a desired position of the plurality of pattern opening portions on the second aperture mask with an energy beam which is passed through the first pattern opening portion of the first aperture; and a transfer unit reducibly transferring the energy beam which is passed through the desired position of the plurality of pattern opening portions of the second aperture mask on a sample.

16. The energy beam exposure apparatus according to claim 15, wherein the plurality of pattern opening portions on the second aperture mask comprises a second pattern opening portion including a plurality of openings, the plurality of openings disposed periodically.

17. The energy beam exposure apparatus according to claim 16, wherein the first and second pattern opening portions are selected so that an opening density of the energy beam which is passed through the first pattern opening portion on the first aperture mask and irradiated on the second pattern opening portion on the second aperture mask becomes larger than an opening density of the second pattern portion.

18. The energy beam exposure apparatus according to claim 16, further comprising a mechanism for matching a position period of the energy beam which is passed through the first pattern opening portion on the first aperture mask and irradiated on the second pattern opening portion on the second aperture mask and a position period of the second pattern opening portion on the second aperture mask.

19. An energy beam exposure method using an aperture mask including character projection patterns comprising:

configuring a character projection pattern corresponding to a desired graphic pattern with opening including linear opening, the liner opening having a width smaller than that of the smallest part of the character projection pattern when a shot pattern of a predetermined pattern can be formed on the sample exposing the character projection pattern corresponding to the desired graphic pattern by a predetermined exposure amount; and forming the shot pattern of the predetermined pattern on the sample by exposing a character projection pattern with the opening including the linear opening by an exposure amount larger than the predetermined exposure amount.

20. An energy beam exposure method using an energy beam exposure apparatus comprising:

preparing an energy beam exposure apparatus, the energy beam exposure apparatus comprising the energy beam exposure apparatus including a first aperture mask comprising a first pattern opening portion, the first pattern opening portion including a plurality of openings, the plurality of openings being disposed periodically; a second aperture mask including a plurality of pattern opening portions; an irradiation unit selectively irradiating a desired position of the plurality of pattern opening portions on the second aperture mask with the energy beam which is passed through the first pattern opening portion of the first aperture; and a transfer unit reducibly transferring a energy beam which is passed through the desired position of the plurality of pattern opening portions of the second aperture mask on a sample;

configuring a pattern opening portion corresponding to a desired graphic pattern with opening including linear opening, the linear opening having a width smaller than that of the smallest part of the pattern opening portion corresponding to the desired graphic pattern when a shot pattern of a predetermined dimension can be formed on the sample by exposing the pattern opening portion corresponding to the desired graphic pattern in the plurality of openings on the second aperture mask by a predetermined exposure amount; and forming the shot pattern of the predetermined dimension on the sample by exposing the pattern opening portion with the opening including the linear opening by an exposure amount larger than the predetermined exposure amount.

21. The energy beam exposure method according to claim 19, wherein the width of the linear opening is a minimum width that can be realized on the aperture mask.

* * * * *